(12) United States Patent
Jeong et al.

(10) Patent No.: US 12,393,073 B2
(45) Date of Patent: Aug. 19, 2025

(54) DISPLAY DEVICE, MULTI-SCREEN DISPLAY DEVICE USING THE SAME AND METHOD FOR MANUFACTURING THE SAME

(71) Applicant: LG Display Co., Ltd., Seoul (KR)

(72) Inventors: WooNam Jeong, Paju-si (KR); SeungChul Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/434,661

(22) Filed: Feb. 6, 2024

(65) Prior Publication Data

US 2024/0210745 A1 Jun. 27, 2024

Related U.S. Application Data

(63) Continuation of application No. 17/953,237, filed on Sep. 26, 2022, now Pat. No. 11,934,058, which is a
(Continued)

(30) Foreign Application Priority Data

Dec. 30, 2016 (KR) ........................ 10-2016-0184460

(51) Int. Cl.
*G02F 1/1333* (2006.01)
*G02F 1/1345* (2006.01)
(Continued)

(52) U.S. Cl.
CPC .... *G02F 1/13336* (2013.01); *G02F 1/133345* (2013.01); *G02F 1/13452* (2013.01); *G02F 1/13454* (2013.01); *G02F 1/136286* (2013.01); *G02F 1/133514* (2013.01); *G02F 1/136277* (2013.01); *G06F 3/04164* (2019.05);
(Continued)

(58) Field of Classification Search
None
See application file for complete search history.

(56) References Cited

U.S. PATENT DOCUMENTS

| 4,183,629 A | 1/1980 | Nishimura et al. |
| 5,670,994 A | 9/1997 | Kawaguchi et al. |
| (Continued) | | |

FOREIGN PATENT DOCUMENTS

| CN | 101118832 A | 2/2008 |
| CN | 102057513 A | 5/2011 |
| (Continued) | | |

*Primary Examiner* — Dung T Nguyen
(74) *Attorney, Agent, or Firm* — Seed IP Law Group LLP

(57) ABSTRACT

Disclosed are a display device, a multi-screen display device using the same, which include a minimized bezel area and a method for manufacturing the display device. The display device including a display substrate including a plurality of subpixels respectively provided in a plurality of pixel areas defined by a plurality of data lines and a plurality of gate lines, a line substrate bonded to the display substrate by using a substrate bonding member and including a plurality of data routing lines, and a side data connection member provided on one side of each of the display substrate and the line substrate to connect the plurality of data lines to the plurality of gate lines in a one-to-one relationship.

21 Claims, 13 Drawing Sheets

Related U.S. Application Data continuation of application No. 17/163,137, filed on Jan. 29, 2021, now Pat. No. 11,487,143, which is a continuation of application No. 15/793,112, filed on Oct. 25, 2017, now Pat. No. 10,935,828.

(51) Int. Cl.

| | | |
|---|---|---|
| *G02F 1/1362* | (2006.01) | |
| *G02F 1/1335* | (2006.01) | |
| *G06F 3/041* | (2006.01) | |
| *H01L 25/075* | (2006.01) | |
| *H10K 59/121* | (2023.01) | |
| *H10K 59/123* | (2023.01) | |
| *H10K 59/124* | (2023.01) | |
| *H10K 59/18* | (2023.01) | |
| *H10K 59/35* | (2023.01) | |

(52) U.S. Cl.
CPC ...... *H01L 25/0753* (2013.01); *H10K 59/1213* (2023.02); *H10K 59/123* (2023.02); *H10K 59/124* (2023.02); *H10K 59/18* (2023.02); *H10K 59/353* (2023.02)

(56) References Cited

U.S. PATENT DOCUMENTS

| | | | |
|---|---|---|---|
| 6,025,901 A | 2/2000 | Adachi et al. | |
| 6,307,606 B1 | 10/2001 | Takii et al. | |
| 6,689,492 B1 * | 2/2004 | Yamazaki | H01L 23/3171 |
| | | | 428/917 |
| 7,567,028 B2 | 7/2009 | Park et al. | |
| 7,663,715 B2 | 2/2010 | Jin et al. | |
| 8,425,069 B2 | 4/2013 | Yamamoto et al. | |
| 8,580,677 B2 | 11/2013 | Chung et al. | |
| 8,766,241 B2 | 7/2014 | Yamazaki et al. | |
| 9,276,230 B2 | 3/2016 | Kim | |
| 9,354,840 B2 | 5/2016 | Seo et al. | |
| 9,443,450 B2 | 9/2016 | Wu | |
| 10,021,762 B1 * | 7/2018 | Tsai | G02F 1/13454 |
| 10,325,936 B2 | 6/2019 | Kang et al. | |
| 10,468,396 B2 | 11/2019 | Kim et al. | |
| 10,935,828 B2 | 3/2021 | Jeong et al. | |
| 2003/0197475 A1 | 10/2003 | Takamura et al. | |
| 2005/0140260 A1 | 6/2005 | Park et al. | |
| 2007/0034402 A1 | 2/2007 | Cheng | |
| 2008/0030124 A1 | 2/2008 | Ryu | |
| 2008/0117367 A1 | 5/2008 | Abe | |
| 2010/0245706 A1 | 9/2010 | Oohira | |
| 2011/0025232 A1 | 2/2011 | Kee et al. | |
| 2011/0304791 A1 | 12/2011 | Takahashi et al. | |
| 2013/0335660 A1 | 12/2013 | Jung et al. | |
| 2014/0085585 A1 | 3/2014 | Sung et al. | |
| 2014/0104528 A1 | 4/2014 | Jung et al. | |
| 2014/0125910 A1 | 5/2014 | Kim et al. | |
| 2014/0159043 A1 | 6/2014 | Sakariya et al. | |
| 2014/0218956 A1 | 8/2014 | Wu | |
| 2015/0115292 A1 | 4/2015 | Jeon et al. | |
| 2015/0261046 A1 | 9/2015 | Miki et al. | |
| 2015/0282293 A1 | 10/2015 | Lim et al. | |
| 2016/0062172 A1 | 3/2016 | Lee et al. | |
| 2016/0316578 A1 | 10/2016 | Cha | |
| 2016/0363800 A1 | 12/2016 | Kim | |
| 2016/0365027 A1 | 12/2016 | Suh | |
| 2016/0372514 A1 | 12/2016 | Chang et al. | |
| 2017/0294424 A1 | 10/2017 | Jeong | |
| 2017/0371195 A1 | 12/2017 | Tomioka et al. | |
| 2018/0175268 A1 | 6/2018 | Moon et al. | |
| 2018/0203294 A1 * | 7/2018 | Chen | G02F 1/133514 |
| 2020/0203450 A1 | 6/2020 | Lou et al. | |

FOREIGN PATENT DOCUMENTS

| | | | |
|---|---|---|---|
| CN | 102201443 A | | 9/2011 |
| CN | 102279483 A | | 12/2011 |
| CN | 103809338 A | | 5/2014 |
| CN | 103872072 A | | 6/2014 |
| JP | 2003022037 A | | 1/2003 |
| JP | 2003043954 A | | 2/2003 |
| JP | 2003295782 A | | 10/2003 |
| JP | 2006164618 A | | 6/2006 |
| JP | 2007-293076 | * | 11/2007 |
| JP | 5341982 B2 | | 11/2013 |
| KR | 20050068191 A | | 7/2005 |
| KR | 20130124101 A | | 11/2013 |

* cited by examiner

DISPLAY DEVICE, MULTI-SCREEN DISPLAY DEVICE USING THE SAME AND METHOD FOR MANUFACTURING THE SAME

CROSS-REFERENCE TO RELATED APPLICATIONS

This application is a continuation of U.S. application Ser. No. 17/953,237, filed Sep. 26, 2022; which is a continuation of U.S. patent application Ser. No. 17/163,137, filed Jan. 29, 2021; which is a continuation of U.S. patent application Ser. No. 15/793,112, filed Oct. 25, 2017; which claims the benefit of the Korean Patent Application No. 10-2016-0184460 filed Dec. 30, 2016, which applications are hereby incorporated by reference as if fully set forth herein.

BACKGROUND

Technical Field

The present disclosure relates to a display device and a multi-screen display device using the same and method for manufacturing the same.

Description of the Related Art

Display devices are being widely used as a display screen of notebook computers, tablet computers, smartphones, portable display devices, and portable information devices in addition to a display screen of television (TVs) and monitors.

Liquid crystal display (LCD) devices and organic light emitting display devices display an image by using thin film transistors (TFTs) as switching elements. Since the LCD devices cannot self-emit light, the LCD devices display an image by using light emitted from a backlight unit which is disposed under a liquid crystal display panel. Since the LCD devices include a backlight unit, a design of the LCD devices is limited, and luminance and a response time are reduced. Since the organic light emitting display devices include an organic material, the organic light emitting display devices are vulnerable to water, causing a reduction in reliability and lifetime.

Recently, research and development on light emitting diode display devices including a light emitting device are being done. The light emitting diode display devices have high image quality and high reliability, and thus, are attracting much attention as next-generation display devices.

A related art light emitting diode display device is manufactured by transferring a light emitting device onto a thin film transistor (TFT) array substrate, and due to time taken in a transfer process for the light emitting device, current transfer technology is more advantageous to display devices having a relatively large size than panels having a relatively small size.

However, the related art light emitting diode display device includes a pad part connected to pixel driving lines of a display substrate and an instrument for covering a display driving circuit unit attached on the pad part, and for this reason, a bezel area increases due to the instrument.

Moreover, in a case where the related art light emitting diode display device is manufactured to have a large size, the number of pixels increases, and for this reason, a transfer error rate of a light emitting device increases, causing a reduction in productivity. In order to solve such a problem, research and development are being recently done on multi-screen devices which realize a large-size screen and are implemented by connecting two or more light emitting diode display devices having a relatively small size. However, in the multi-screen devices, due to a bezel area of each of the two or more light emitting diode display devices, a seam (or a boundary portion) exists between display devices coupled to each other. When displaying one image on a whole screen, the boundary portion causes a sense of discontinuity of the whole screen, causing a reduction in degree of viewing immersion of a user.

BRIEF SUMMARY

Accordingly, the present disclosure is directed to providing a display device and a multi-screen display device using the same that may substantially obviate one or more problems due to limitations and disadvantages of the related art.

An aspect of the present disclosure is directed to providing a display device and a multi-screen display device using the same, which include a minimized bezel area.

Another aspect of the present disclosure is directed to provide a multi-screen display device in which a boundary portion between adjacent display devices is minimized.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device including a display substrate including a plurality of subpixels respectively provided in a plurality of pixel areas defined by a plurality of data lines and a plurality of gate lines, a line substrate bonded to the display substrate by using a substrate bonding member and including a plurality of data routing lines, and a side data connection member provided on one side of each of the display substrate and the line substrate to connect the plurality of data lines to the plurality of gate lines in a one-to-one relationship.

The line substrate may have a size equal to or less than a size of the display substrate, and the one side of the line substrate may be disposed on the same line as the one side of the display substrate with respect to a thickness direction of the display substrate.

The display device may further include a side gate connection member connected to the plurality of gate lines, provided on the other side of each of the display substrate and the line substrate, in a one-to-one relationship, wherein the line substrate may further include a plurality of gate routing lines connected to the side gate connection member in a one-to-one relationship.

The display substrate may include a first display area and a second display area surrounding the first display area, a plurality of first unit pixels provided in the first display area and each including a plurality of subpixels each including a light emitting device, and a plurality of second unit pixels provided in the second display area overlapping an edge of the display substrate and each including a plurality of subpixels and having a size less than a size of each of the plurality of first unit pixels.

The plurality of first unit pixels may be arranged at a reference pixel pitch, and a distance between a center portion of each of the plurality of second unit pixels and an outer surface of the display substrate may be half or less of the reference pixel pitch.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
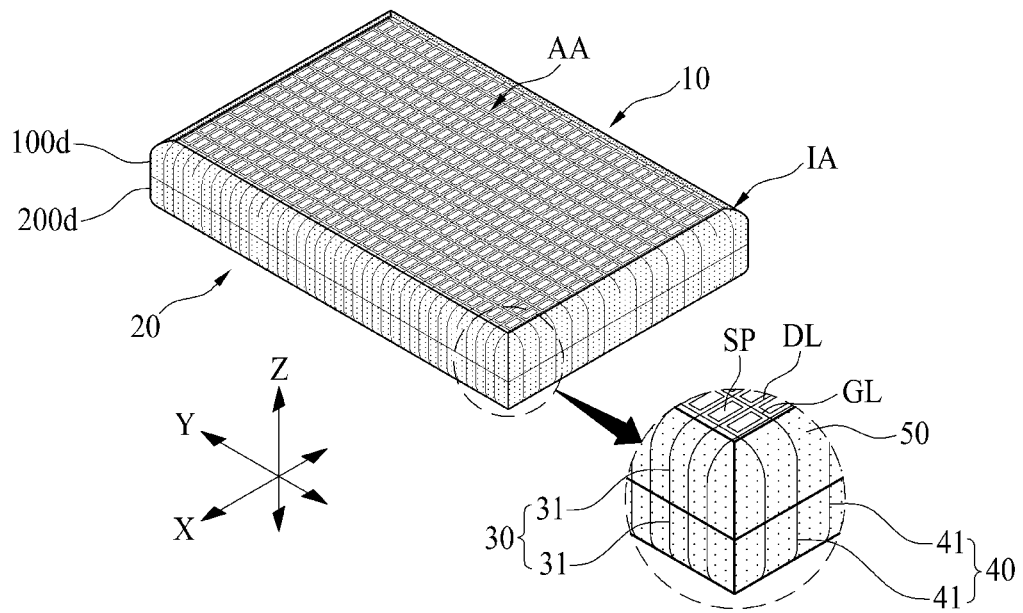
FIG. 1 is an isometric view illustrating a display device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a time relationship, for example, when the temporal order is described as 'after~,' 'subsequent~,' 'next~,' and 'before~,' a case which is not continuous may be included unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of a display device and a multi-screen display device using the same according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Figure 2:
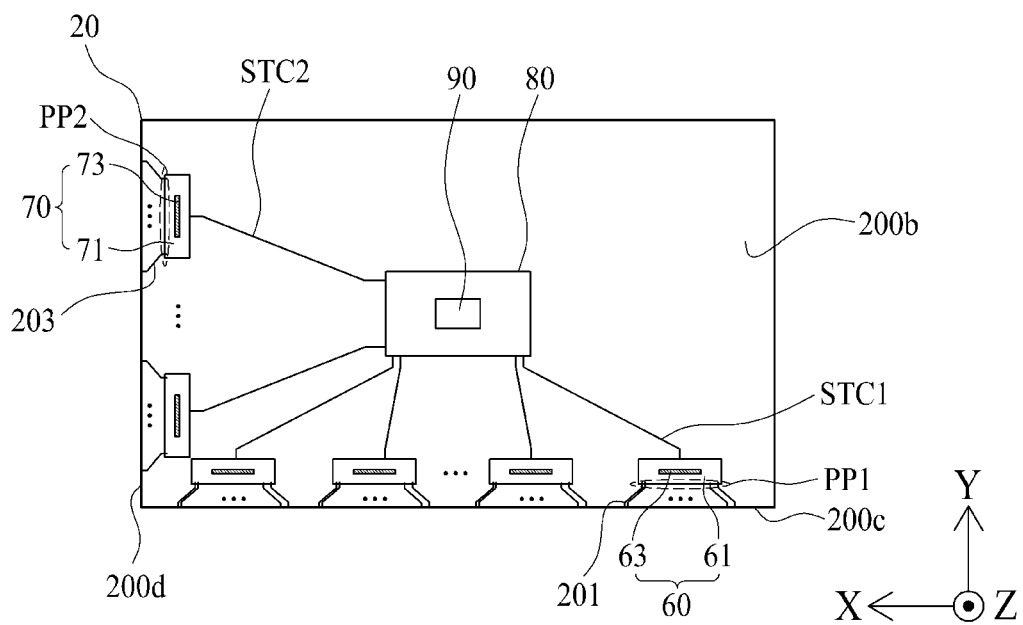
FIG. 2 is a plan view illustrating a line substrate illustrated in FIG. 1.
Figure 3:
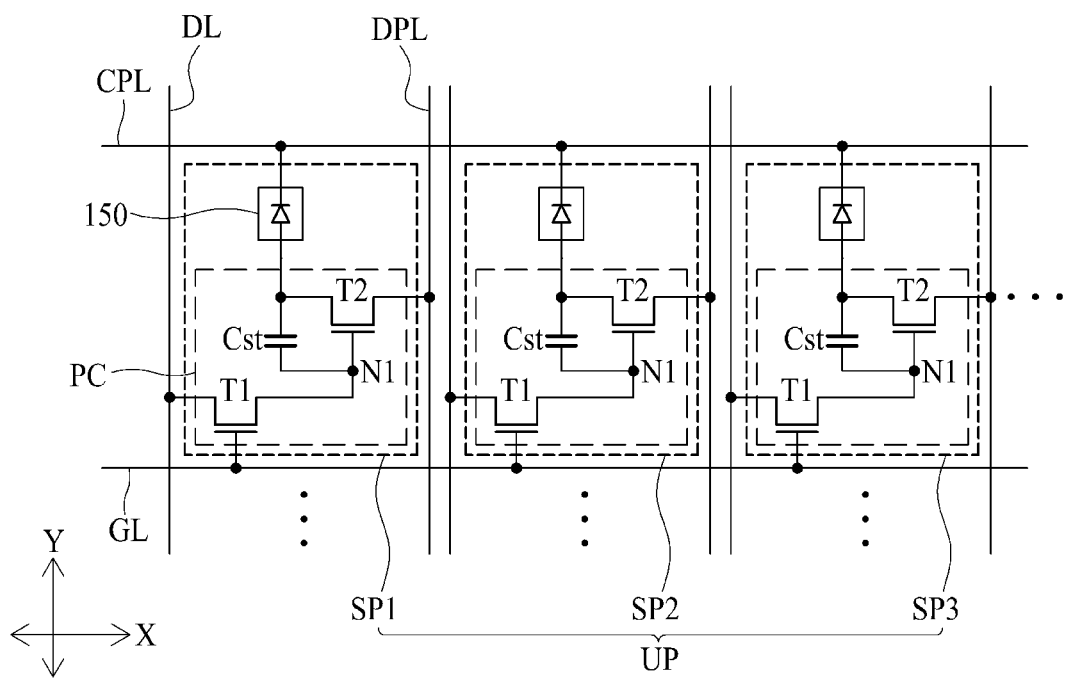
FIG. 3 is a circuit diagram of a unit pixel illustrated in FIG. 1.
Figure 4:
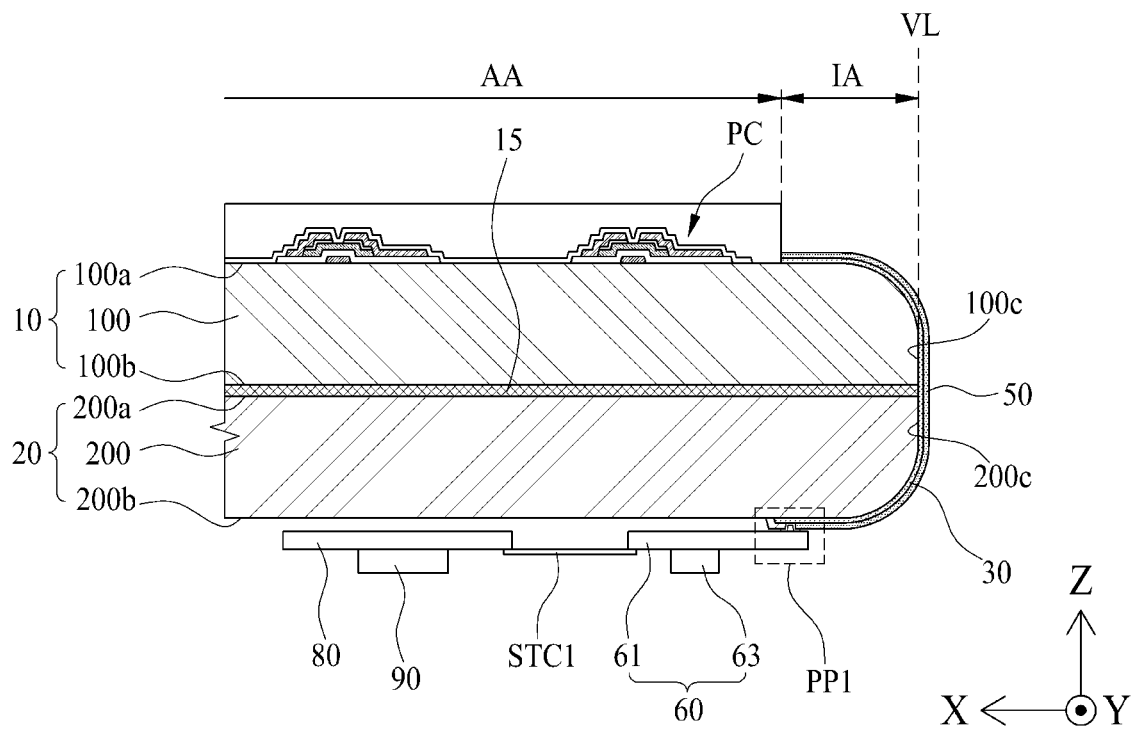
FIG. 4 is a cross-sectional view illustrating one edge of the display device illustrated in FIG. 1.

FIG. 1 is an isometric view illustrating a display device according to an embodiment of the present disclosure. FIG. 2 is a plan view illustrating a line substrate illustrated in FIG. 1. FIG. 3 is a circuit diagram of a unit pixel illustrated in FIG. 1. FIG. 4 is a cross-sectional view illustrating one edge of the display device illustrated in FIG. 1.

Referring to FIGS. 1 to 4, the display device according to the present embodiment may include a display substrate 10, a line substrate 20, and a side data connection member 30.

The display substrate 10 may be defined as a thin film transistor (TFT) array substrate. The display substrate 10 according to an embodiment may include a first base substrate 100, a plurality of pixel driving lines, and a plurality of subpixels SP1 to SP3.

The first base substrate 100 may be formed of glass or a plastic material, and for example, may be formed a glass material. The first base substrate 100 according to an embodiment may include a display area (or an active area) AA and a non-display area (or an inactive area) IA. The display area AA may be defined as a center area other than an edge of the first base substrate 100. The non-display area IA may be defined to surround the display area AA and may overlap the edge of the first base substrate 100. The non-display area IA may have a relatively very narrow width and may be defined as a bezel area.

The pixel driving lines may be provided on a front surface 100a of the first base substrate 100 and may supply signals necessary for each of the plurality of subpixels SP1 to SP3. The pixel driving lines according to an embodiment may include a plurality of data lines DL, a plurality of gate lines GL, a plurality of driving power lines DPL, and a plurality of common power lines CPL.

The plurality of data lines DL may be provided on the front surface 100a of the first base substrate 100, may long extend along a second horizontal axis direction Y, may be arranged along a first horizontal axis direction X, and may be spaced apart from each other by a certain interval. Here, the first horizontal axis direction X may be parallel to a first lengthwise direction X of the display device, for example, a long side length direction or a widthwise direction of the display device, and the second horizontal axis direction Y may be parallel to a second lengthwise direction Y of the display device, for example, a short side length direction or a lengthwise direction of the display device.

The plurality of gate lines GL may be provided on the front surface 100a of the first base substrate 100 to intersect the plurality of data lines DL, may long extend along the first horizontal axis direction X, may be arranged along the second horizontal axis direction Y, and may be spaced apart from each other by a certain interval.

The plurality of driving power lines DPL may be provided on the first base substrate 100 in parallel with the plurality of data lines DL and may be formed along with the plurality of data lines DL. Each of the plurality of driving power lines DPL may supply a pixel driving power, supplied from the outside, to adjacent subpixels SP1 to SP3.

The plurality of common power lines CPL may be arranged on the first substrate base 100 in parallel with the plurality of gate lines GL and may be formed along with the plurality of gate lines GL. Each of the plurality of common power lines CPL may supply a common power, supplied from the outside, to adjacent subpixels SP1 to SP3.

The plurality of subpixels SP1 to SP3 may be respectively provided in a plurality of subpixel areas defined by intersections of the gate lines GL and the data lines DL. Each of the plurality of subpixels SP1 to SP3 may be defined as an area corresponding to a minimum unit where light is actually emitted.

At least three adjacent subpixels SP1 to SP3 may configure one unit pixel UP for displaying colors. For example, the one unit pixel UP may include a red subpixel SP1, a green subpixel SP2, and a blue subpixel SP3 which are adjacent to each other along the first horizontal axis direction X, and may further include a white subpixel for enhancing luminance.

Optionally, each of the driving power lines DPL may be provided in one corresponding unit pixel of a plurality of unit pixels UP. In this case, at least three subpixels SP1 to SP3 configuring each of unit pixel UP may share one driving power line DPL. Therefore, the number of driving power lines for driving each of the subpixels SP1 to SP3 is reduced, and in proportion to the reduced number of the driving power lines, an aperture rate of each of the unit pixels UP increases or a size of each of the unit pixel UP decreases.

The plurality of subpixels SP1 to SP3 according to an embodiment may each include a pixel circuit PC and a light emitting device 150.

The pixel circuit PC may be provided in a circuit area defined in each subpixel SP and may be connected to a gate line GL, a data line DL, and a driving power line DPL which are adjacent thereto. The pixel circuit PC may control a current flowing in the light emitting device 150 according to a data signal supplied through the data line DL in response to a scan pulse supplied through the gate line GL, based on the pixel driving power supplied through the driving power line DPL. The pixel circuit PC according to an embodiment may include a switching TFT T1, a driving TFT T2, and a capacitor Cst.

The switching TFT T1 may include a gate electrode connected to the gate line GL, a first electrode connected to the data line DL, and a second electrode connected to a gate electrode N1 of the driving TFT T2. Here, each of the first and second electrodes of the switching TFT T1 may be a source electrode or a drain electrode according to a direction of a current. The switching TFT T1 may be turned on according to the scan pulse supplied through the gate line GL and may supply the data signal, supplied through the data line DL, to the driving TFT T2.

The driving TFT T2 may be turned on by a voltage supplied through the switching TFT T1 and/or a voltage of the capacitor Cst to control the amount of current flowing from the driving power line DPL to the light emitting device 150. To this end, the driving TFT T2 according to an embodiment may include a gate electrode connected to the second electrode N1 of the switching TFT T1, a drain electrode connected to the driving power line DPL, and a source electrode connected to the light emitting device 150. The driving TFT T2 may control a data current flowing from the driving power line DPL to the light emitting device 150 according to the data signal supplied through the switching TFT T1, thereby allowing the light emitting device 150 to emit light having brightness proportional to the data signal.

The capacitor Cst may be provided in an overlap area between the gate electrode N1 and the source electrode of the driving TFT T2, may store a voltage corresponding to the data signal supplied to the gate electrode of the driving TFT T2, and may turn on the driving TFT T2 with the stored voltage.

Optionally, the pixel circuit PC may further include at least one compensation TFT for compensating for a threshold voltage shift of the driving TFT T2, and moreover, may further include at least one auxiliary capacitor. The pixel circuit PC may be additionally supplied with a compensation power such as an initialization voltage, based on the number of TFTs and auxiliary capacitors. Therefore, the pixel circuit PC according to the present embodiment may drive the light emitting device 150 through a current driving manner identically to each subpixel of an organic light emitting display device, and thus, may be replaced with a pixel circuit of organic light emitting display devices known to those skilled in the art.

The light emitting device 150 may be provided in each of the plurality of subpixels SP1 to SP3. The light emitting device 150 may be electrically connected to the pixel circuit PC of a corresponding subpixel SP and a corresponding common power line CPL, and thus, may emit light with a current flowing from the pixel circuit PC (i.e., the driving TFT T2) to the common power line CPL. The light emitting device 150 according to an embodiment may be a light emitting device or a light emitting diode chip which emits one of red light, green light, blue light, and white light. For example, the light emitting device 150 may be a light emitting device or a micro light emitting diode chip. Here, the micro light emitting diode chip may have a scale of 1 μm to 100 μm, but is not limited thereto. In other embodiments, the light emitting diode chip may have a size which is less than that of an emissive area other than a circuit area occupied by the pixel circuit PC in a corresponding subpixel area.

The line substrate 20 may include a plurality of routing lines, which are connected to the pixel driving lines provided on the display substrate 10 in a one-to-one relationship, and may be bonded to the display substrate 10. That is, the line substrate 20 may be bonded to a rear surface of the display substrate 10 by using a substrate bonding member 15. The line substrate 20 may transfer signals to the pixel driving lines and may increase a stiffness of the display substrate 10. Here, the substrate bonding member 15 may include an optical clear adhesive (OCA) or an optical clear resin (OCR).

The line substrate 20 according to an embodiment may include a second base substrate 200 and a plurality of data routing lines 201.

The second base substrate 200 may be formed of a glass material, a plastic material, and/or the like. For example, the second base substrate 200 may be formed of a material which is the same as that of the first base substrate 100, or may be formed of tempered glass. Here, the tempered glass may include one of sapphire glass and gorilla glass or stacked glass thereof.

The second base substrate 200 according to an embodiment may have the same size as that of the display substrate 10. In this case, one side 200c of the second base substrate 200 may be disposed on the same vertical line VL as one side 100c of the display substrate 10 with respect to a vertical axis direction Z parallel to a thickness direction of the display substrate 10, but may slightly protrude an outward direction with respect to the vertical line VL within an alignment process error or may be disposed more inward than the vertical line VL. A front surface 200a of the second base substrate 200 may be bonded to the display substrate 100 (i.e., a whole rear surface 100b of the first base substrate 100) by using the substrate bonding member 15.

The plurality of data routing lines 201 may be provided on a rear surface 200b of the second base substrate 200 in parallel with the plurality of data lines DL provided on the display substrate 10. In this case, one edge of each of the plurality of data routing lines 201 may overlap one edge of a corresponding data line of the plurality of data lines DL provided on the display substrate 10 in a one-to-one relationship.

Each of the plurality of data routing lines 201 according to an embodiment may have a line width which is relatively wider than that of each of the plurality of data lines DL, for decreasing a line resistance. That is, unlike the display substrate 10, a pixel circuit including a TFT and/or the like is not provided on the second base substrate 200, and a plurality of lines for supplying signals to the pixel driving lines may be provided on the second base substrate 200, whereby a relatively large spare space is provided in an area where the data routing lines are provided. Therefore, in the present embodiment, by increasing a line width of each of the plurality of data routing lines through the spare space of the second base substrate 200, the voltage drop (IR drop), caused by the line resistance, of a signal applied to each of the plurality of data routing lines is minimized.

The line substrate 20 according to an embodiment may further include at least one first pad part PP1 and at least one second pad part PP2.

The at least one first pad part PP1 may include a plurality of data pads which are provided on the line substrate 20 and are respectively connected to the plurality of data routing lines 201 in a one-to-one relationship. That is, the at least one first pad part PP1 may be connected to a corresponding data routing line of the plurality of data routing lines 201 and may be provided on an end of a corresponding data routing line of the plurality of data routing lines 201. Therefore, one end of each of the plurality of data routing lines 201 may be connected to the other end of a corresponding first side routing pattern of a plurality of first side routing patterns 31 in a one-to-one relationship, and the other end of each of the plurality of data routing lines 201 may be connected to a corresponding data pad of the plurality of data pads in a one-to-one relationship.

The at least one second pad part PP2 may include a plurality of gate pads which are provided on the line substrate 20 and are respectively connected to a plurality of gate routing lines 203 in a one-to-one relationship. That is, the at least one second pad part PP2 may be connected to a corresponding gate routing line of the plurality of gate routing lines 203 and may be provided on an end of a corresponding gate routing line of the plurality of gate routing lines 203. Therefore, one end of each of the plurality of gate routing lines 203 may be connected to the other end of a corresponding second side routing pattern of a plurality of second side routing patterns 41 in a one-to-one relationship, and the other end of each of the plurality of gate routing lines 203 may be connected to a corresponding gate pad of the plurality of gate pads in a one-to-one relationship.

The side data connection member 30 may be provided on the one side 100c of the display substrate 10 and the one side 200c of the line substrate 20 and may connect the plurality of data lines DL to the plurality of data routing lines 201 in a one-to-one relationship.

The side data connection member 30 according to an embodiment may include the plurality of first side routing patterns 31. Each of the plurality of first side routing patterns 31 may be directly provided on the one side 100c of the display substrate 10 and the one side 200c of the line substrate 20 and may connect the plurality of data lines DL to the plurality of data routing lines 201 in a one-to-one relationship. Each of the plurality of first side routing patterns 31 may be provided to surround the one side 100c of the display substrate 10 and the one side 200c of the line substrate 20 and may be connected between a corresponding data line DL and a corresponding data routing line 201. In this case, one side of each of the plurality of first side routing patterns 31 may be electrically connected to an end of a corresponding data line DL, and the other side may be electrically connected to an end of a corresponding data routing line 201. Each of the plurality of first side routing patterns 31 may be provided by a printing process using a conductive paste.

The side data connection member 30 according to an embodiment may include a data flexible film and the plurality of first side routing patterns 31.

The data flexible film may be provided to surround the one side 100c of the display substrate 10 and the one side 200c of the line substrate 20.

The plurality of first side routing patterns 31 may be provided on the data flexible film in parallel with the plurality of data lines DL provided on the display substrate 10. A portion other than both edges of each of the plurality of first side routing patterns 31 may be covered by a passivation layer covering the data flexible film. Therefore, one side of each of the plurality of first side routing patterns 31 exposed to one edge of the data flexible film may be electrically connected to an end of a corresponding data line DL, and the other side of each of the plurality of first side routing patterns 31 exposed to the other edge of the data flexible film may be electrically connected to an end of a corresponding data routing line 201. The side data connection member 30 using the data flexible film as a base may be a flexible printed circuit cable.

A corner between the front surface 100a and the side of the first base substrate 100 may be chamfered to have a certain angle or length, or may be rounded to have a certain curvature. That is, the corner between the front surface 100a and the side of the first base substrate 100 may be chamfered or rounded for preventing a disconnection of the side data connection member 30 provided in the corner between the front surface 100a and the side of the first base substrate 100.

The display device according to the present embodiment may further include the plurality of gate routing lines 203 provided on the line substrate 20.

The plurality of gate routing lines 203 may be provided on the rear surface 200b of the second base substrate 200 in parallel with the plurality of gate lines GL provided on the display substrate 10. In this case, one edge of each of the plurality of gate routing lines 203 may overlap one edge of a corresponding gate line of the plurality of gate lines GL provided on the display substrate 10 in a one-to-one relationship.

Each of the plurality of gate routing lines 203 according to an embodiment may have a line width which is relatively wider than that of each of the plurality of gate lines GL, for decreasing a line resistance. That is, in the second base substrate 200, a relatively large spare space is provided in an area where the gate routing lines are provided. Therefore, in the present embodiment, by increasing a line width of each of the plurality of gate routing lines through the spare space of the second base substrate 200, the voltage drop (IR drop), caused by the line resistance, of a signal applied to each of the plurality of gate routing lines is minimized.

The display device according to the present embodiment may further include a side gate connection member 40.

The side gate connection member 40 may be provided on the other side 100d of the display substrate 10 and the other side 200d of the line substrate 20 and may connect the plurality of gate lines GL to the plurality of gate routing lines 203 in a one-to-one relationship.

The side gate connection member 40 according to an embodiment may include the plurality of second side routing patterns 41. Each of the plurality of second side routing patterns 41 may be directly provided on the other side 100d of the display substrate 10 and the other side 200d of the line substrate 20 and may connect the plurality of gate lines GL to the plurality of gate routing lines 203 in a one-to-one relationship. Each of the plurality of second side routing patterns 41 may be provided to surround the other side 100d of the display substrate 10 and the other side 200d of the line substrate 20 and may be connected between a corresponding gate line GL and a corresponding gate routing line 203. In this case, one side of each of the plurality of second side routing patterns 41 may be electrically connected to an end of a corresponding gate line GL, and the other side may be electrically connected to an end of a corresponding gate routing line 203. Each of the plurality of second side routing patterns 41 may be provided by a printing process using a conductive paste.

The side gate connection member 40 according to an embodiment may be manufactured as a flexible printed circuit cable based on a flexible film and may be provided to surround the other side 100d of the display substrate 10 and the other side 200d of the line substrate 20. For example, the side gate connection member 40 may include a gate flexible film and the plurality of second side routing patterns 41.

The gate flexible film may be provided to surround the other side 100d of the display substrate 10 and the other side 200d of the line substrate 20.

The plurality of second side routing patterns 41 may be provided on the gate flexible film in parallel with the plurality of gate lines GL provided on the display substrate 10. A portion other than both edges of each of the plurality of second side routing patterns 41 may be covered by the passivation layer covering the gate flexible film. Therefore, one side of each of the plurality of second side routing patterns 41 exposed to one edge of the gate flexible film may be electrically connected to an end of a corresponding gate line GL, and the other side of each of the plurality of second side routing patterns 41 exposed to the other edge of the gate flexible film may be electrically connected to an end of a corresponding gate routing line 203.

A corner between the rear surface 200b and the side of the second base substrate 200 may be chamfered to have a certain angle or length, or may be rounded to have a certain curvature. That is, the corner between the rear surface 200b and the side of the second base substrate 200 may be chamfered or rounded for preventing a disconnection of the side gate connection member 40 provided in the corner between the rear surface 200b and the side of the second base substrate 200.

The display device according to the present embodiment may further include a side sealing member 50.

The side sealing member 50 may be provided to cover an outer surface of each of the display substrate 10 and the line substrate 20 bonded to each other. The side sealing member 50 may cover the side data connection member 30 provided on the one side 100c of the display substrate 10 and the one side 200c of the line substrate 20 and the side gate connection member 40 provided on the other side 100d of the display substrate 10 and the other side 200d of the line substrate 20, thereby electrically insulating the side data connection member 30 from the side gate connection member 40 and protecting the side data connection member 30 from the side gate connection member 40 from an external impact.

The display device according to the present embodiment may include a data driving circuit 60, a gate driving circuit 70, a control board 80, and a timing controller 90.

The data driving circuit 60 may supply a corresponding data voltage to each of the plurality of data lines DL provided on the display substrate 10. The data driving circuit 60 according to an embodiment may include a plurality of data flexible circuit films 61 and a plurality of data driving integrated circuits (ICs) 63.

The plurality of data flexible circuit films 61 may be respectively attached on, through a film attachment process, the plurality of first pad parts PP1 provided on the second base substrate 200 of the line substrate 20 in a one-to-one relationship.

Each of the plurality of data driving ICs 63 may be individually mounted on a corresponding data flexible circuit film of the plurality of data flexible circuit films 61. The data driving ICs 63 may receive subpixel data and a data control signal supplied from the timing controller 90, convert the subpixel data into analog data voltages by subpixels according to the data control signal, and respectively supply the analog data voltages to the data lines DL.

Optionally, the plurality of data driving ICs 63 may be directly mounted on the line substrate 20 (i.e., the rear surface 200d of the second base substrate 200) so as to be respectively connected to the plurality of first pad parts PP1 in a one-to-one relationship without being mounted on the data flexible circuit films 61. Here, the plurality of data driving ICs 63 may be mounted on the second base substrate 200 through a chip mounting process based on a chip-on glass (COG) type. In this case, the data flexible circuit films 61 may be removed, and thus, a configuration of the data driving circuit 60 is simplified.

The gate driving circuit 70 may supply a corresponding scan pulse to each of the plurality of gate lines DL provided on the display substrate 10. The gate driving circuit 70 according to an embodiment may include a plurality of gate flexible circuit films 71 and a plurality of gate driving ICs 73.

The plurality of gate flexible circuit films 71 may be respectively attached on, through a film attachment process, the plurality of second pad parts PP2 provided on the second base substrate 200 of the line substrate 20 in a one-to-one relationship.

Each of the plurality of gate driving ICs 73 may be individually mounted on a corresponding gate flexible circuit film of the plurality of gate flexible circuit films 71. Each of the gate driving ICs 73 may generate a scan pulse, based on a gate control signal supplied from the timing controller 90 and may supply the generated scan pulse to a corresponding gate line GL corresponding to a predetermined order.

Optionally, the plurality of gate driving ICs 73 may be directly mounted on the line substrate 20 (i.e., the rear surface 200d of the second base substrate 200) so as to be respectively connected to the plurality of second pad parts PP2 in a one-to-one relationship without being mounted on the gate flexible circuit films 71. Here, the plurality of gate driving ICs 73 may be mounted on the second base substrate 200 through a chip mounting process based on a COG type. In this case, the gate flexible circuit films 71 may be removed, and thus, a configuration of the gate driving circuit 70 is simplified.

Figure 5:
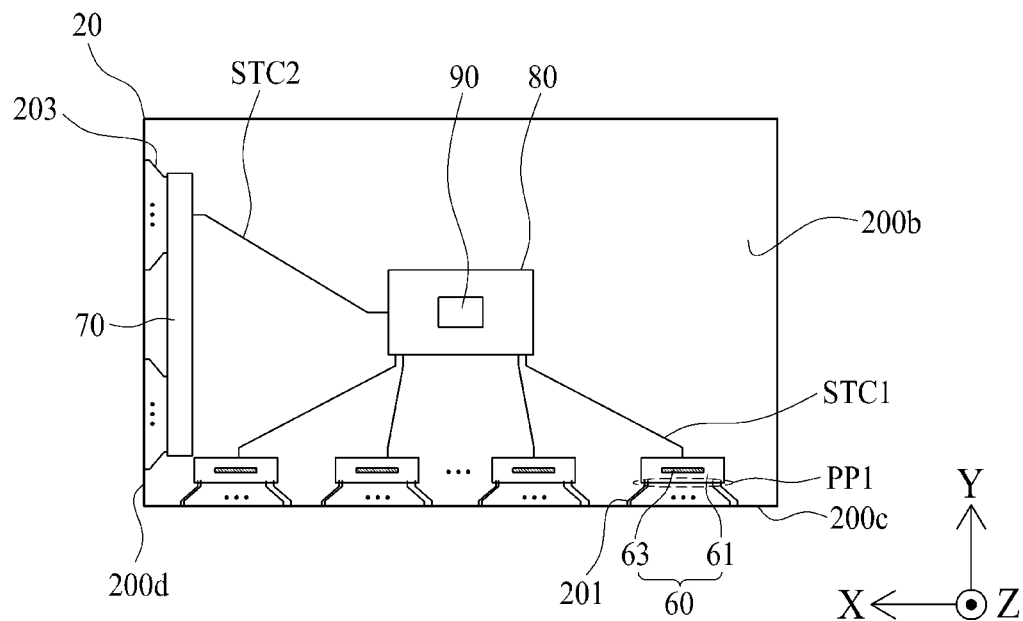
FIG. 5 is a cross-sectional view illustrating the line substrate illustrated in FIG. 1.

The gate driving circuit 70 according to an embodiment, as illustrated in FIG. 5, may be separately manufactured as an IC type, directly provided on the rear surface 200d of the second base substrate 200 through a TFT manufacturing process without being mounted on the second base substrate 200, and connected to the plurality of gate routing lines 203 in a one-to-one relationship. In this case, the gate driving circuit 70 may be configured with a shift register including a plurality of stages which output a scan pulse to the gate routing lines 203 according to a predetermined order by using a gate control signal (i.e., a gate start signal and a plurality of gate shift clocks) supplied from the timing controller 90.

Referring again to FIGS. 1 to 4, the control board 80 may be connected to the plurality of data flexible circuit films 61 and the plurality of gate flexible circuit films 71. For example, the control board 80 may be electrically connected to the plurality of data flexible circuit films 61 through a plurality of first signal transmission cables STC1 and may be electrically connected to the plurality of gate flexible circuit films 71 through a plurality of second signal transmission cables STC2. The control board 80 may support the timing controller 90 and may transfer signals and power between the elements of the display driving circuit.

The timing controller 90 may be mounted on the control board 80 and may receive image data and a timing synchronization signal supplied from a display driving system through a user connector provided on the control board 80. The timing controller 90 may align the image data according to a subpixel arrangement structure of the display area AA based on the timing synchronization signal to generate subpixel data and may supply the generated subpixel data to a corresponding data driving IC 63. Also, the timing controller 90 may generate the data control signal and the gate control signal, based on the timing synchronization signal and may control a driving timing of each of the data driving ICs 63 and the gate driving ICs 73.

Optionally, the plurality of data driving ICs 63, the plurality of gate driving ICs 73, and the timing controller 90 may be integrated into one integration driving IC. In this case, the one integration driving IC may be mounted on the line substrate 20 (i.e., the rear surface 200d of the second base substrate 200), and each of the plurality of data routing lines 201 and the plurality of gate routing lines 203 may be additionally routed on the rear surface 200d of the second base substrate 200 and may be electrically connected to a corresponding channel provided in the integration driving IC. In this case, the plurality of first pad parts PP1, the plurality of second pad parts PP2, the plurality of data flexible circuit films 61, and the plurality of gate flexible circuit films 71 may be omitted, and thus, a configuration of the display driving circuit is simplified.

In addition, in the present embodiment, corners of the first base substrate 100 of the display substrate 10 and corners of the second base substrate 200 of the line substrate 20 may be chamfered to have a certain angle or length, or may be rounded to have a certain curvature. Therefore, in the present embodiment, the plurality of first side routing patterns 31 and the plurality of second side routing patterns 41 may be easily formed in the corners of the first base substrate 100 of the display substrate 10 and the corners of the second base substrate 200 of the line substrate 20 without disconnection.

As described above, in the display device according to the present embodiment, a signal for pixel driving may be supplied to the pixel driving lines provided on the display substrate 10 through the line substrate 20 and the side connection members 30 and 40, and thus, the display device has a minimized or zeroed bezel area by removing the pad parts provided in a bezel area of the display substrate 10 and has a bezel width suitable for minimizing a boundary portion between display devices coupled to each other in a multi-screen display device.

Figure 6:
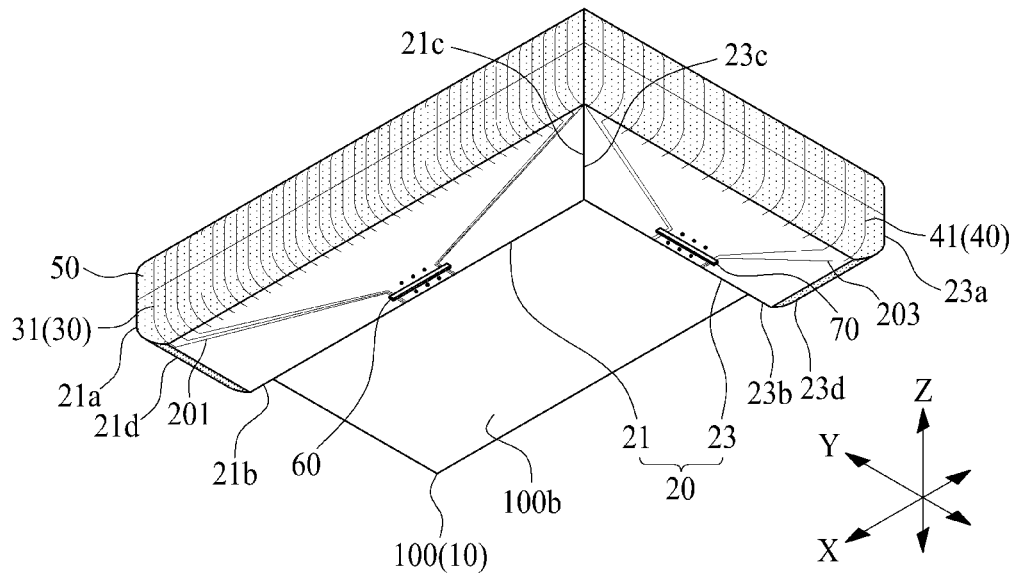
FIG. 6 is an isometric view for describing a display device according to an embodiment of the present disclosure.

FIG. 6 is an isometric view for describing a display device according to an embodiment of the present disclosure and illustrates an example where a configuration of the line substrate in the display device illustrated FIG. 1 is modified. Hereinafter, therefore, only a line substrate and elements relevant thereto will be described.

Referring to FIG. 6 along with FIG. 1, a line substrate 20 according to the present embodiment may include a data line substrate 21, bonded to a portion of a rear surface of a display substrate 10, and a gate line substrate 23 bonded to a portion of the rear surface of the display substrate 10.

The data line substrate 21 may be bonded to one rear surface of the display substrate 10. That is, the data line substrate 20 may be bonded to one rear surface 100b of the display substrate 10 overlapping one edge of each of the plurality of data lines DL by using a substrate bonding member. The data line substrate 21 may include a plurality of data routing lines 201 and one side disposed on the same line as one side of the display substrate 10 with respect to a thickness direction Z of the display substrate 10, and may be connected to a data driving circuit 60.

In the data line substrate 21 according to an embodiment, one side 21a may have the same length as the one side of the display substrate 10, the other side 21b opposite to the one side 21a may have a length which is shorter than that of the one side 21a, one short side 21c connecting one side of the one side 21a to one side of the other side 21b may be inclined, and the other short side 21d connecting the other side of the one side 21a to the other side of the other side 21b may be provided in a rectilinear shape. That is, the one side 21a of the data line substrate 21 may have the same length as the one side of the display substrate 10 for connecting the plurality of data routing lines 201 to a plurality of first side routing patterns 31 in a one-to-one relationship, and the one short side 21c of the data line substrate 21 may be inclined for preventing overlapping or interference between the data line substrate 21 and the gate line substrate 23.

The data driving circuit 60 may be configured as an IC type and may be directly mounted on a rear surface of the data line substrate 21 so as to be connected to each of the plurality of data routing lines 201 through a chip mounting process based on a chip-on glass type. To this end, the data line substrate 21 may include a data chip mounting area with the data driving circuit 60 having a chip type mounted thereon and a data pad part connected to the data chip mounting area. The data pad part may be connected to the control board 80 through a plurality of first signal transmission cables STC1 (see FIG. 3).

The gate line substrate 23 may be bonded to the other rear surface of the display substrate 10. That is, the gate line substrate 20 may be bonded to the other rear surface 100b of the display substrate 10 overlapping one edge of each of the plurality of gate lines GL by using a substrate bonding member. The gate line substrate 23 may include a plurality of gate routing lines 203 and the other side disposed on the same line as the other side of the display substrate 10 with respect to the thickness direction Z of the display substrate 10, and may be connected to a gate driving circuit 70.

The gate driving circuit 70 may be configured as an IC type and may be directly mounted on a rear surface of the gate line substrate 23 so as to be connected to each of the plurality of gate routing lines 203 through a chip mounting process based on a chip-on glass type. To this end, the gate line substrate 23 may include a gate chip mounting area with the gate driving circuit 70 having a chip type mounted thereon and a gate pad part connected to the gate chip mounting area. The gate pad part may be connected to the control board 80 through a plurality of second signal transmission cables STC2 (see FIG. 3).

Optionally, as illustrated in FIG. 5, the gate driving circuit 70 may be separately manufactured as an IC type, directly provided on the rear surface of the gate line substrate 23 through a TFT manufacturing process without being mounted on the gate line substrate 23, and connected to the plurality of gate routing lines 203 in a one-to-one relationship.

In the gate line substrate 23 according to an embodiment, the other side 23a may have the same length as the other side of the display substrate 10, one side 23b opposite to the other side 23a may have a length which is shorter than that of the other side 23a, one short side 23c connecting one side of the one side 23b to one side of the other side 23a may be inclined, and the other short side 23d connecting the other side of the one side 23b to the other side of the other side 23a may be provided in a rectilinear shape. That is, the other side 23a of the gate line substrate 23 may have the same length as the other side of the display substrate 10 for connecting the plurality of gate routing lines 203 to a plurality of second side routing patterns 41 in a one-to-one relationship, and the one short side 23c of the gate line substrate 23 may be inclined for preventing overlapping or interference between the data line substrate 21 and the gate line substrate 23.

The display device according to the present embodiment provides the same effects as those of the display device illustrated in FIGS. 1 to 5. Also, the display device according to the present embodiment may include a spare space provided on the rear surface of the display substrate 10 which is not bonded to the line substrate 20, and the spare space may be used as an accommodating space for a display driving system such as a control board. Accordingly, the display device according to the present embodiment has a thin thickness.

Figure 7:
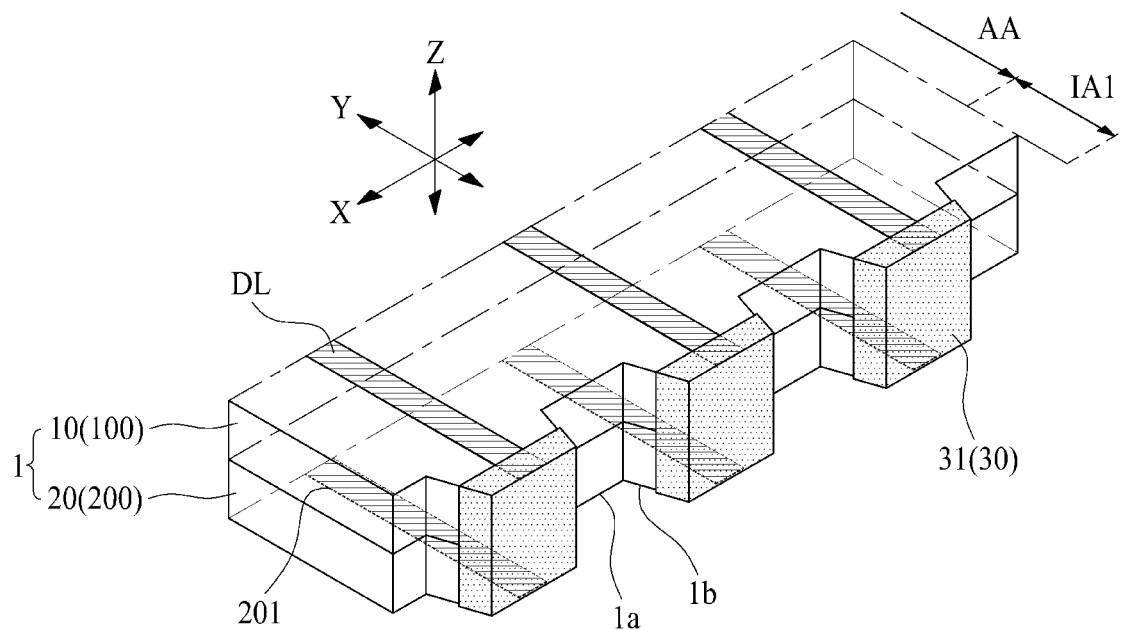
FIG. 7 is an isometric view for describing a side data connection member of the display device illustrated in FIGS. 1 and 6.

FIG. 7 is an isometric view for describing the side data connection member of the display device illustrated in FIGS. 1 and 6.

Referring to FIG. 7, a bonded substrate 1 including a display substrate 10 and a line substrate 20 bonded to each other may include a plurality of grooves 1a provided in a first non-display area IA1.

The first non-display area IA1 of the bonded substrate 1 may be defined as a lower non-display area of the bonded substrate 1 overlapping an edge of each of the plurality of data lines DL.

The plurality of first grooves 1a may be arranged at certain intervals along a first horizontal axis direction X and may be provided concavely in a direction from one side of the bonded substrate 1 to a display area AA. The plurality of first grooves 1a according to an embodiment may be formed through a substrate cutting process. The substrate cutting process according to an embodiment may cut a portion of an edge of the bonded substrate 1 corresponding to a space between the plurality of data lines DL by using a laser scribing process to form the plurality of first grooves 1a. Therefore, the one side of the bonded substrate 1 may include the concavely provided plurality of grooves 1a and a plurality of protrusions 1b which are provided between the plurality of first grooves 1a and respectively overlap ends of the plurality of data lines DL.

In the display device according to the present embodiment, a side data connection member 30 may be provided in each of the plurality of protrusions 1b provided on one side of the bonded substrate 1 and may connect ends of the plurality of data lines DL to a plurality of data routing lines 201 in a one-to-one relationship. The side data connection member 30 according to an embodiment may include a plurality of first side routing patterns 31 respectively surrounding the plurality of first protrusions 1b.

Each of the plurality of first side routing patterns 31 may be provided to surround half or less of a corresponding first protrusion of the plurality of first protrusions 1b. That is, each of the plurality of first side routing patterns 31 may be provided to fully surround approximate half of a corresponding first protrusion of the plurality of first protrusions 1b and may be provided through a dipping process using a conductive solution or a silver paste. Therefore, each of the plurality of first side routing patterns 31 may be electrically connected to an end of a corresponding data line of the plurality of data lines DL in a front surface of a corresponding first protrusion of the plurality of first protrusions 1b and may be electrically connected to an end of a corresponding data routing line of the plurality of data routing lines 201 in a rear surface of a corresponding first protrusion of the plurality of first protrusions 1b, thereby electrically connecting a corresponding data line DL to a corresponding data routing line 201.

In addition, in the display device according to the present embodiment, the bonded substrate 1 may further include a plurality of second grooves, which are provided in a second non-display area and respectively overlap ends of the plurality of gate lines, and a plurality of second protrusions each provided between two adjacent second grooves of the plurality of second grooves. Also, the plurality of gate routing lines are respectively formed in the plurality of second protrusions provided on the other side of the bonded substrate 1 in the same structure and method as the above-described plurality of data routing lines, and thus, their detailed descriptions are omitted. Here, the second non-display area of the bonded substrate 1 may be defined as a right non-display area of the bonded substrate 1 overlapping an edge of each of the plurality of gate lines GL.

Figure 8A:
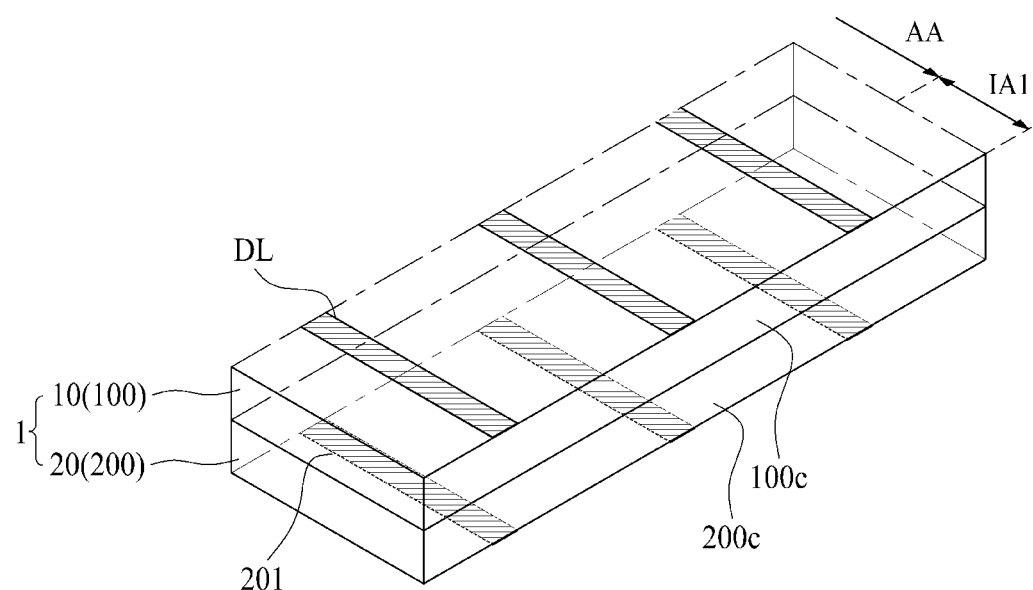
FIGS. 8A to 8C are isometric views for describing a method of manufacturing the side data connection member illustrated in FIG. 7.
Figure 8B:
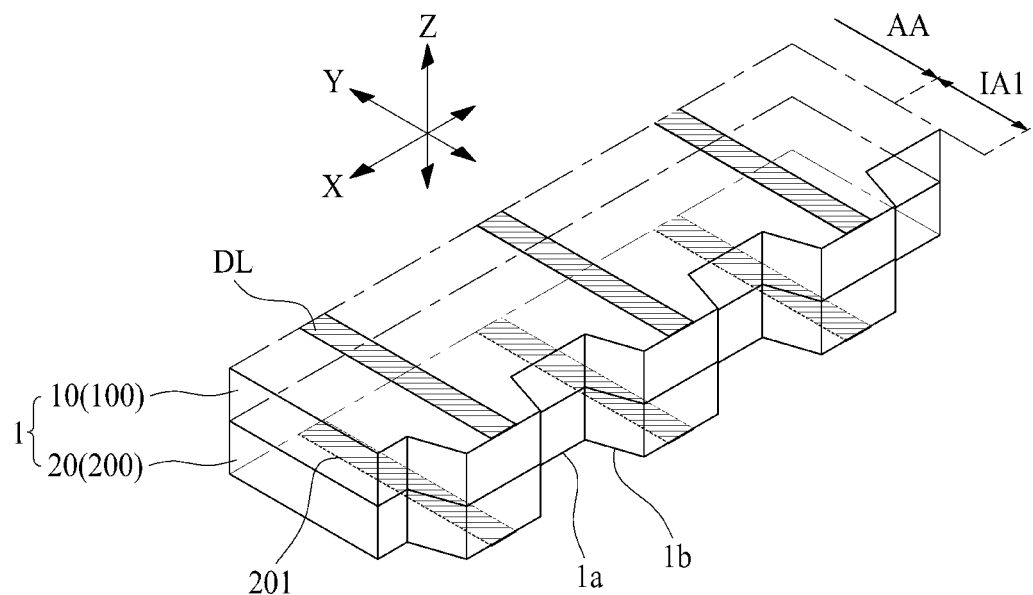
Figure 8C:
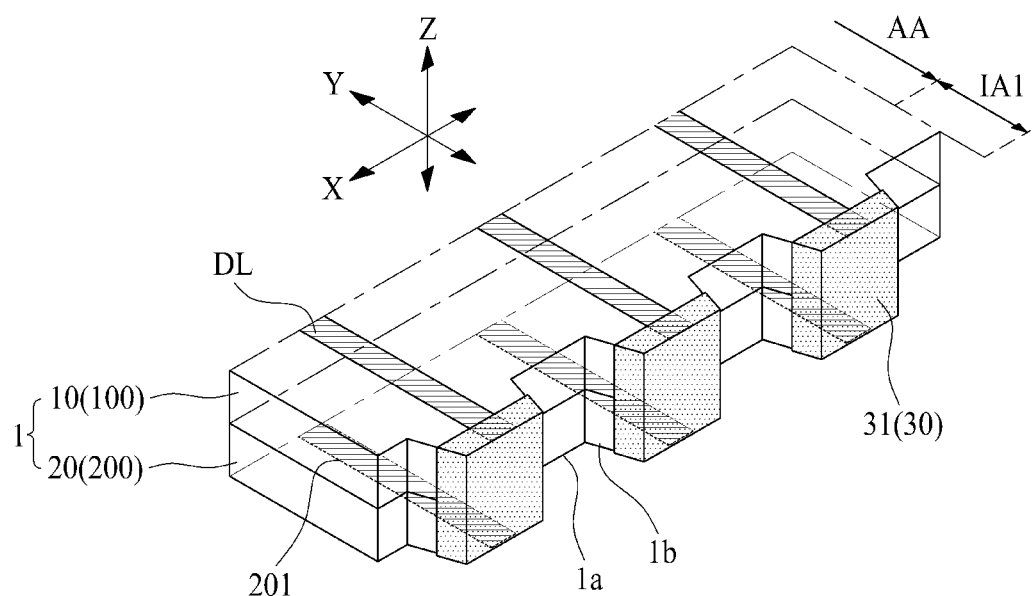

FIGS. 8A to 8C are isometric views for describing a method of manufacturing the display device illustrated in FIG. 7.

The method of manufacturing the side data connection member according to the present embodiment will be described with reference to FIGS. 8A to 8C.

First, a display substrate 10 including a plurality of subpixels respectively provided in a plurality of pixel areas defined by a plurality of data lines and a plurality of gate lines may be provided, and a line substrate 20 including a plurality of data routing lines 201 and a plurality of gate routing lines may be provided.

Subsequently, as illustrated in FIG. 8A, a bonded substrate 1 may be provided by bonding the display substrate 10 to the line substrate 20 with a substrate bonding member. In this case, one side 100c of the display substrate 10 and one side 200c of the line substrate 20 may be disposed on the same vertical line.

Subsequently, as illustrated in FIG. 8B, a plurality of first grooves 1a may be formed on the one side 100c and the one side 200c of the bonded substrate 1 through a substrate cutting process in order for ends of the plurality of data lines DL to protrude. The substrate cutting process according to an embodiment may cut a portion of each of the one side 100c and the one side 200c of the bonded substrate 1 corresponding to a space between the plurality of data lines DL by using a laser scribing process to form the plurality of first grooves 1a, thereby providing a plurality of first protrusions 1b respectively overlapping ends of the plurality of data lines DL and ends of the plurality of data routing lines 201.

Subsequently, as illustrated in FIG. 8C, a side data connection member 30 (i.e., a plurality of first side routing patterns 31) which respectively surround the plurality of first protrusions 1b provided on the one side 100c and the one side 200c of the bonded substrate 1 in a one-to-one relationship may be formed. For example, the plurality of first side routing patterns 31 may be formed by a dipping process of dipping approximate half of each of the first protrusions 1b into a conductive solution and coating the conductive solution on a front surface, a side surface, and a rear surface of each of the plurality of first protrusions 1b. By performing the dipping process, each of the plurality of first side routing patterns 31 respectively covering the ends of the plurality of data lines DL and the ends of the plurality of data routing lines 201 may be individually provided, and the plurality of first side routing patterns 31 may be electrically separated from each other by the plurality of first grooves 1a provided on the one side 100c and the one side 200c of the bonded substrate 1. Here, the conductive solution may include a conductive paste, for example, a silver paste.

In addition, in the display device according to the present embodiment, except that a side gate connection member is provided on the other side of the bonded substrate 1, the side gate connection member according to the present embodiment is provided in the same structure and manufacturing method as those of the above-described side data connection member, and thus, its detailed description is omitted.

Subsequently, when the side data connection member is provided on the one side of the bonded substrate 1 and the side gate connection member is provided on the other side of the bonded substrate 1, a side sealing member may be formed on each side of the bonded substrate 1, thereby protecting each side of the bonded substrate 1 and electrically insulating the side data connection member 30 from the side gate connection member.

By using the side data connection member, the side gate connection member, and the method of manufacturing the same according to the present embodiment, a process of forming a side routing pattern on a side of the bonded substrate 1 is simplified, electrical short circuit between adjacent side routing lines is prevented, and a chamfering process or a rounding process for an edge of each of the display substrate 10 and the line substrate 20 or an edge of the bonded substrate 1 may be omitted. The side data connection member, the side gate connection member, and the method of manufacturing the same according to the present embodiment may be identically applied to a below-described display device according to an embodiment of the present disclosure.

Figure 9:
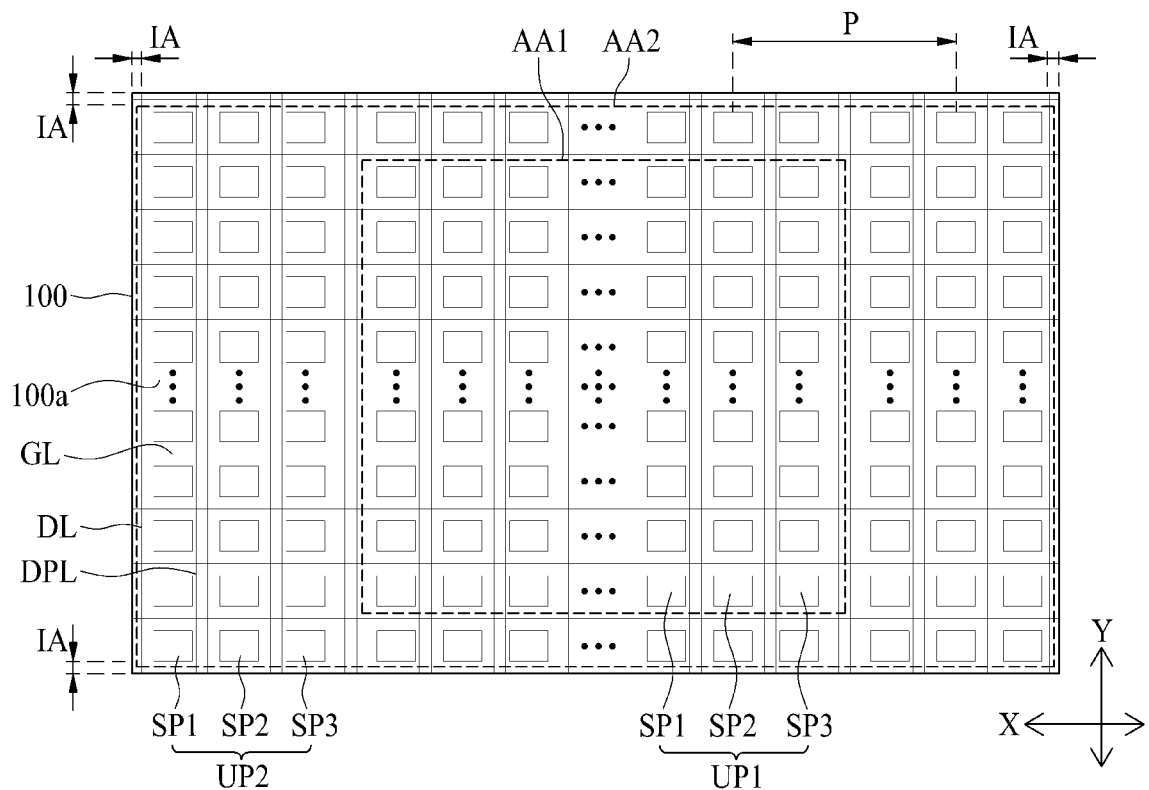
FIG. 9 is a plan view for describing a display substrate of a display device according to an embodiment of the present disclosure.

FIG. 9 is a plan view for describing a display substrate of a display device according to an embodiment of the present disclosure.

Referring to FIG. 9, a display substrate 10 (i.e., a first base substrate 100) of the display device according to the present embodiment may include a first display area AA1, a second display area AA2, a bezel area BA, a plurality of first unit pixels UP1, and a plurality of second unit pixels UP2.

The first display area AA1 may be defined as a center area other than an edge of the first base substrate 100. The second display area AA2 may be defined to surround the first display area AA1 and may overlap an edge of the first base substrate 100.

A non-display area IA may be provided between each side of the display substrate 100 and the second display area AA2, may have a relatively very narrow width, and may be defined as the bezel area BA.

The plurality of first unit pixels UP1 may be provided in the first display area AA1. In this case, the plurality of first unit pixels UP1 may be arranged at a predetermined first reference pixel pitch along a first horizontal axis direction X and at a predetermined second reference pixel pitch along a second horizontal axis direction Y in the first display area AA1. The first reference pixel pitch P may be defined as a distance between center portions of two first unit pixels UP1 which are adjacent to each other along the first horizontal axis direction X, and the second reference pixel pitch may be defined as a distance between center portions of two first unit pixels UP1 which are adjacent to each other along the second horizontal axis direction Y.

The plurality of second unit pixels UP2 may be provided in the second display area AA2. In this case, the second unit pixels UP2 may each have a size which is less than that of each of the first unit pixels UP1. That is, a distance between a center portion of each of the second unit pixels UP2 and an outer surface of the first base substrate 100 may be set to half or less of each of the reference pixel pitches.

Adjacent first unit pixel UP1 and second unit pixel UP2 may be provided to have a reference pixel pitch P. Therefore, in the display device according to the present embodiment, the plurality of first unit pixels UP1 provided on the first base substrate 100 of the display substrate 10 may have the same size and may be arranged at the same reference pixel pitch, and in this case, a size of each of a plurality of second unit pixels UP2 adjacent to the outer surface of the first base substrate 100 is reduced, whereby the display device has a bezel width suitable for minimizing a boundary portion between display devices coupled to each other in a multi-screen display device.

The plurality of first unit pixels UP1 and the plurality of second unit pixels UP2 may each include at least three adjacent subpixels SP1 to SP3. The subpixels SP1 to SP3 are as described above, and thus, their detailed descriptions are omitted.

In the display substrate 10 according to the present embodiment, a size of the second unit pixel UP2 provided in the second display area AA2 overlapping the edge of the first base substrate 100 may be set less than that of the first unit pixel UP1 provided in the first display area AA1 of the first base substrate 100, and thus, the display device has a bezel width suitable for minimizing a boundary portion between display devices coupled to each other in a multi-screen display device.

Figure 10:
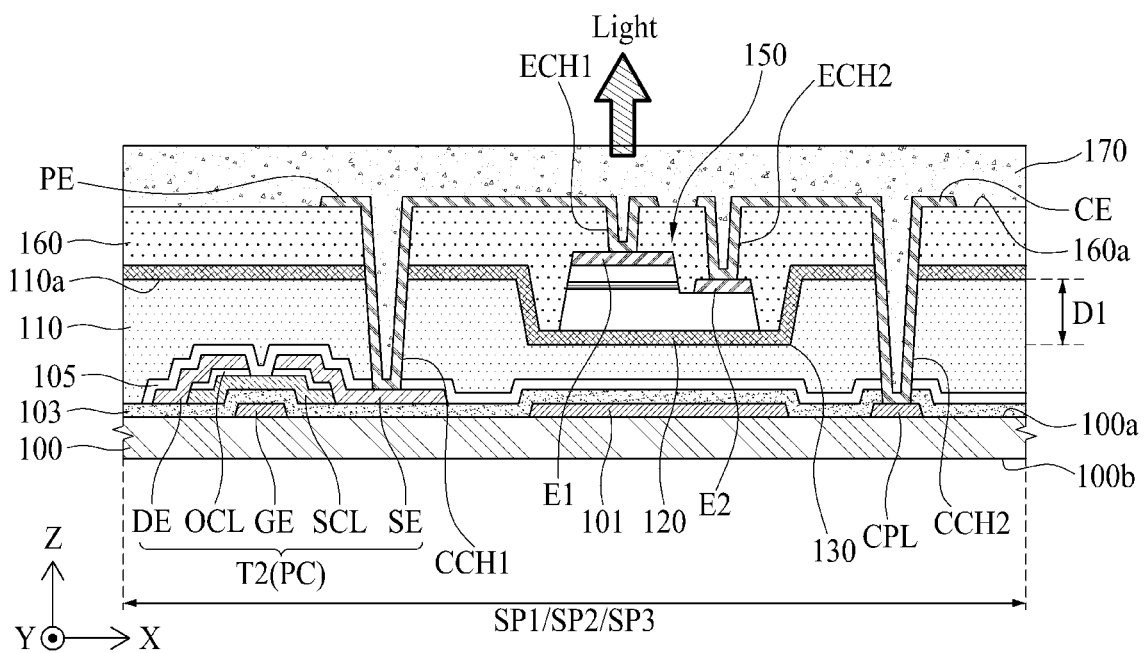
FIG. 10 is a cross-sectional view for describing a structure of one subpixel illustrated in FIG. 9.
Figure 11:
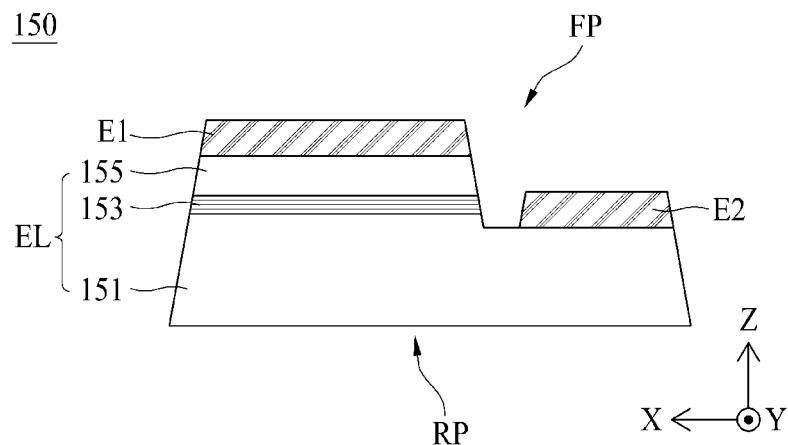
FIG. 11 is a cross-sectional view for describing a structure of a light emitting device illustrated in FIG. 10.

FIG. 10 is a cross-sectional view for describing a structure of one subpixel illustrated in FIG. 9, and FIG. 11 is a cross-sectional view for describing a structure of a light emitting device illustrated in FIG. 10.

Referring to FIGS. 10 and 11 along with FIG. 9, a plurality of subpixels SP1 to SP3 of a display substrate 10 according to the present embodiment may each include a pixel circuit PC, a passivation layer 110, a concave portion 130, a light emitting device 150, a planarization layer 160, a pixel electrode PE, and a common electrode CE.

First, in FIG. 10, a thickness of a first base substrate 100 is relatively thinly illustrated, but the first base substrate 100 may substantially have a thickness which is relatively much thicker than a total thickness of a layered structure provided on the first base substrate 100.

The pixel circuit PC may include a switching TFT T1, a driving TFT T2, and a capacitor Cst. The pixel circuit PC is as described above, and thus, its detailed description is not provided. Hereinafter, a structure of the driving TFT T2 will be described for example.

The driving TFT T2 may include a gate electrode GE, a semiconductor layer SCL, an ohmic contact layer OCL, a source electrode SE, and a drain electrode DE.

The gate electrode GE may be formed on the first base substrate 100 along with the gate line GL. The gate electrode GE may be covered by a gate insulation layer 103. The gate insulation layer 103 may be formed of a single layer or a multilayer including an inorganic material and may be formed of silicon oxide (SiOx) silicon nitride (SiNx), and/or the like.

The semiconductor layer SCL may be provided in a predetermined pattern (or island) type on the gate insulation layer 103 to overlap the gate electrode GE. The semiconductor layer SCL may be formed of a semiconductor material including one of amorphous silicon, polycrystalline silicon, oxide, and an organic material, but is not limited thereto.

The ohmic contact layer OCL may be provided in a predetermined pattern (or island) type on the semiconductor layer SCL. Here, the ohmic contact layer OCL is for an ohmic contact between the semiconductor layer SCL and the source and drain electrodes SE and DE and may be omitted.

The source electrode SE may be formed on one side of the ohmic contact layer OCL to overlap one side of the semiconductor layer SCL. The source electrode SE may be formed along with the data lines DL and the driving power lines DPL.

The drain electrode DE may be formed on the other side of the ohmic contact layer OCL to overlap the other side of the semiconductor layer SCL and may be spaced apart from the source electrode SE. The drain electrode DE may be formed along with the source electrode SE and may branch or protrude from an adjacent driving power line DPL.

In addition, the switching TFT T1 configuring the pixel circuit PC may be formed in a structure which is the same as that of the driving TFT T2. In this case, the gate electrode of the switching TFT T1 may branch or protrude from the gate line GL, the first electrode of the switching TFT T1 may branch or protrude from the data line DL, and the second electrode of the switching TFT T1 may be connected to the gate electrode GE of the driving TFT T2 through a via hole provided in the gate insulation layer 103.

The pixel circuit PC may be covered by an interlayer insulation layer 105. The interlayer insulation layer 105 may be provided all over the first base substrate 100 to cover the pixel circuit PC including the driving TFT T2. The interlayer insulation layer 105 according to an embodiment may be formed of an inorganic material, such as SiOx or SiNx, or an organic material such as benzocyclobutene or photo acryl. The interlayer insulation layer 105 may not be provided.

The passivation layer 110 may be provided all over the first base substrate 100 to cover a subpixel SP (i.e., the pixel circuit PC), or may be provided all over the first base substrate 100 to cover the interlayer insulation layer 105. The passivation layer 110 may protect the pixel circuit PC including the driving TFT T2 and may provide a planarization surface on the interlayer insulation layer 105. The passivation layer 110 according to an embodiment may be formed of an organic material such as benzocyclobutene or photo acryl, and particularly, may be formed of photo acryl for convenience of a process.

The concave portion 130 may be provided in an emissive area of a subpixel area defined in the subpixel SP and may accommodate the light emitting device 150. The concave portion 130 according to an embodiment may be provided concavely from the passivation layer 110 to have a certain depth D1. In this case, the concave portion 130 may include an accommodating space which is provided concavely from a top 110a of the passivation layer 110 to have a depth D1 corresponding to a thickness (or a total height) of the light emitting device 150. Here, a floor surface of the concave portion 130 may be formed by removing a portion of the passivation layer 110, a whole portion of the passivation layer 110, the whole portion of the passivation layer 110 and a portion of the interlayer insulation layer 105, or a whole portion of each of the passivation layer 110, the interlayer insulation layer 105, and the gate insulation layer 103 in order to have the depth D1 which is set based on the thickness of the light emitting device 150. For example, the concave portion 130 may be provided to have a depth of 2 μm to 6 μm from the top 110a of the passivation layer 110. The concave portion 130 may have a groove or cup shape having a size which is wider than a rear surface (or a bottom) of the light emitting device 150.

The concave portion 130 according to an embodiment may include an inclined surface provided between the floor surface and the top 110a of the passivation layer 110, and the inclined surface may allow light emitted from the light emitting device 150 to travel toward the front of concave portion 130.

The light emitting device 150 may be mounted on the concave portion 130 and may be electrically connected to the pixel circuit PC and a common power line CPL, and thus, may emit light with a current flowing from the pixel circuit PC (i.e., the driving TFT T2) to the common power line CPL. The light emitting device 150 according to an embodiment may include a light emitting layer EL, a first electrode (or an anode terminal) E1, and a second electrode (or a cathode terminal) E2.

The light emitting layer EL may emit light according to a recombination of an electron and a hole based on a current flowing between the first electrode E1 and the second electrode E2. The light emitting layer EL according to an embodiment may include a first semiconductor layer 151, an active layer 153, and a second semiconductor layer 155.

The first semiconductor layer 151 may supply an electron to the active layer 153. The first semiconductor layer 151 according to an embodiment may be formed of an n-GaN-based semiconductor material, and examples of the n-GaN-based semiconductor material may include GaN, AlGaN, InGaN, AlInGaN, etc. Here, silicon (Si), germanium (Ge), selenium (Se), tellurium (Te), or carbon (C) may be used as impurities used for doping of the first semiconductor layer 151.

The active layer 153 may be provided on one side of the first semiconductor layer 151. The active layer 153 may have a multi quantum well (MQW) structure which includes a well layer and a barrier layer which is higher in band gap than the well layer. The active layer 153 according to an embodiment may have an MQW structure of InGaN/GaN or the like.

The second semiconductor layer 155 may be provided on the active layer 153 and may supply a hole to the active layer 153. The second semiconductor layer 155 according to an embodiment may be formed of a p-GaN-based semiconductor material, and examples of the p-GaN-based semiconductor material may include GaN, AlGaN, InGaN, AlInGaN, etc. Here, magnesium (Mg), zinc (Zn), or beryllium (Be) may be used as impurities used for doping of the second semiconductor layer 155.

The first electrode E1 may be provided on the second semiconductor layer 155. The first electrode E1 may be connected to the source electrode SE of the driving TFT T2.

The second electrode E2 may be provided on the other side of the first semiconductor layer 151 and may be electrically disconnected from the active layer 153 and the second semiconductor layer 155. The second electrode E2 may be connected to the common power line CPL.

Each of the first and second electrodes E1 and E2 according to an embodiment may be formed of a material including one or more materials of a metal material, such as gold (Au), tungsten (W), platinum (Pt), silicon (Si), iridium (Ir), silver (Ag), copper (Cu), nickel (Ni), titanium (Ti), or chromium (Cr), and an alloy thereof. In other embodiments, each of the first and second electrodes E1 and E2 may be formed of a transparent conductive material, and examples of the transparent conductive material may include indium tin oxide (ITO), indium zinc oxide (IZO), etc. However, the present embodiment is not limited thereto.

In addition, the first semiconductor layer 151, the active layer 153, and the second semiconductor layer 155 may be provided in a structure of being sequentially stacked on a semiconductor substrate. Here, the semiconductor substrate may include a semiconductor material included in a sapphire substrate or a silicon substrate. The semiconductor substrate may be used as a growth semiconductor substrate for growing each of the first semiconductor layer 151, the active layer 153, and the second semiconductor layer 155, and then, may be separated from the first semiconductor layer 151 through a substrate separation process. Here, the substrate separation process may be a laser lift-off process or a chemical lift-off process. Therefore, since the growth semiconductor substrate is removed from the light emitting device 150, the light emitting device 150 has a thin thickness, and thus, may be accommodated into the concave portion 130 provided in each subpixel SP.

The light emitting device 150 may emit the light according to the recombination of the electron and the hole based on the current flowing between the first electrode E1 and the second electrode E2. In this case, the light emitted from the light emitting device 150 may pass through the first and second electrodes E1 and E2 and may be output to the outside. In other words, the light emitted from the light emitting device 150 may pass through the first and second electrodes E1 and E2 and may be output in a second direction opposite to a first direction toward the floor surface of the concave portion 130, thereby displaying an image.

The light emitting device 150 may include a first portion (or a front portion) FP, including the first and second electrodes E1 and E2 connected to the pixel circuit PC, and a second portion (or a rear portion) RP opposite to the first portion FP. In this case, the first portion FP may be disposed relatively farther away from the floor surface of the concave portion 130 than the second portion RP. Here, the first portion FP may have a size which is less than that of the second portion RP, and in this case, the light emitting device 150 may have a cross-sectional surface having a trapezoid shape which includes a top corresponding to the first portion FP and a bottom corresponding to the second portion RP.

The planarization layer 160 may be provided on the passivation layer 110 to cover the light emitting device 150. That is, the planarization layer 160 may be provided on the passivation layer 110 to have a thickness which enables the planarization layer 160 to cover a top of the passivation layer 110 and a front surface of the other accommodating space of the concave portion 130 into which the light emitting device 150 is accommodated.

The planarization layer 160 may provide a planarization surface on the passivation layer 110. Also, the planarization layer 160 may be buried into the other accommodating space of the concave portion 130 into which the light emitting device 150 is accommodated, thereby fixing a position of the light emitting device 150.

The pixel electrode PE may electrically connect the first electrode E1 of the light emitting device 150 to the source electrode SE of the driving TFT T2 and may be defined as an anode electrode. The pixel electrode PE according to an embodiment may be provided on a top 160a of the planarization layer 160 overlapping the driving TFT T2 and the first electrode E1 of the light emitting device 150. The pixel electrode PE may be electrically connected to the source electrode SE of the driving TFT T2 through a first circuit contact hole CCH1 which is provided to pass through the interlayer insulation layer 105, the passivation layer 110, and the planarization layer 160, and may be electrically connected to the first electrode E1 of the light emitting device 150 through a first electrode contact hole ECH1 provided in the planarization layer 160. Therefore, the first electrode E1 of the light emitting device 150 may be electrically connected to the source electrode SE of the driving TFT T2 through the pixel electrode PE. If the display device has a top emission structure, the pixel electrode PE may be formed of a transparent conductive material, and if the display device has a bottom emission structure, the pixel electrode PE may be formed of a light reflection conductive material. Here, the transparent conductive material may be indium tin oxide (ITO), indium zinc oxide (IZO), or the like, but is not limited thereto. The light reflection conductive material may be Al, Ag, Au, Pt, Cu, or the like, but is not limited thereto. The pixel electrode PE including the light reflection conductive material may be formed of a single layer including the light reflection conductive material or a multilayer including a plurality of the single layers which are stacked.

The common electrode CE may be electrically connected to the second electrode E2 of the light emitting device 150 and the common power line CPL and may be defined as a cathode electrode. The common electrode CE may be provided on the top 160a of the planarization layer 160 overlapping the second electrode E2 of the light emitting device 150 and the common power line CPL. Here, the common electrode CE may be formed of a material which is the same as that of the pixel electrode PE.

One side of the common electrode CE according to an embodiment may be electrically connected to the common power line CPL through a second circuit contact hole CCH2 which is provided to pass through the gate insulation layer 103, the interlayer insulation layer 105, the passivation layer 110, and the planarization layer 160. The other side of the common electrode CE may be electrically connected to the second electrode E2 of the light emitting device 150 through a second electrode contact hole ECH2 which is provided in the planarization layer 160 to overlap the second electrode E2 of the light emitting device 150. Therefore, the second electrode E2 of the light emitting device 150 may be electrically connected to the common power line CPL through the common electrode CE.

The pixel electrode PE and the common electrode CE according to an embodiment may be simultaneously provided through an electrode patterning process using a lithography process, an etching process, and a deposition process of depositing an electrode material on the planarization layer 160 including the first and second circuit contact holes CCH1 and CCH2 and the first and second electrode contact holes ECH1 and ECH2. Therefore, in the present embodiment, since the common electrode CE and the pixel electrode PE connecting the light emitting device 150 and the pixel circuit PC are simultaneously formed, an electrode connection process is simplified, and a process time taken in a process of connecting the light emitting device 150 and the pixel circuit PC is considerably shortened, thereby enhancing a productivity of the light emitting diode display device.

The display device according to the present embodiment may further include a transparent buffer layer 170.

The transparent buffer layer 170 may be provided on the first base substrate 100 to cover a whole portion of the planarization layer 160 where the pixel electrode PE and the common electrode CE are provided, and thus, may provide a planarization surface on the planarization layer 160, thereby protecting the light emitting device 150 and the pixel circuit PC from an external impact. Therefore, the pixel electrode PE and the common electrode CE may be provided between the planarization layer 160 and the transparent buffer layer 170. The transparent buffer layer 170 may be an optical clear adhesive (OCA) or an optical clear resin (OCR), but is not limited thereto.

The display device according to the present embodiment may further include a reflective layer 101 provided under an emissive area of each subpixel SP.

The reflective layer 101 may be provided between the floor surface of the concave portion 130 and the first base substrate 100 to overlap the emissive area including the light emitting device 150. The reflective layer 101 according to an embodiment may be formed of a material which is the same as that of the gate electrode GE of the driving TFT T2, and may be provided on the same layer as the gate electrode GE. The reflective layer 101 may reflect light, which is incident from the light emitting device 150, toward the first portion FP of the light emitting device 150. Accordingly, the display device according to the present embodiment may include the reflective layer 101, and thus, may have a top emission structure. However, if the display device according to the present embodiment has a bottom emission structure, the reflective layer 101 may be omitted.

Optionally, the reflective layer 101 may be formed of a material which is the same as that of the source/drain electrode SE/DE of the driving TFT T2, and may be provided on the same layer as the source/drain electrode SE/DE.

In the display device according to the present embodiment, the light emitting device 150 mounted in each subpixel SP may be adhered to the floor surface of the concave portion 130 by an adhesive member 120.

The adhesive member 120 may be disposed between the concave portion 130 of each subpixel SP and the light emitting device 150 and may attach the light emitting device 150 on the floor surface of the concave portion 130, thereby primarily fixing the light emitting display device 150.

The adhesive member 120 according to an embodiment may be attached (coated) on the second portion RP of the light emitting device 150 (i.e., a back surface of the first semiconductor layer 151), and thus, in a mounting process of mounting the light emitting device 150 onto the concave portion 130, the adhesive member 120 may be adhered to the concave portion 130 of each subpixel SP.

In other embodiments, the adhesive member 120 may be dotted onto the concave portion 130 of each subpixel SP and may be spread by pressure which is applied thereto in a mounting process performed for the light emitting device 150, and thus, may be adhered to the second portion RP of the light emitting device 150. Therefore, the light emitting device 150 mounted on the concave portion 130 may be primarily position-fixed by the adhesive member 120. Accordingly, according to the present embodiment, the mounting process for the light emitting device 150 may be performed in a method of simply attaching the light emitting device 150 on the floor surface of the concave portion 130, and thus, a mounting process time taken in performing the mounting process for the light emitting device 150 is shortened.

In other embodiments, the adhesive member 120 may be coated on the top 110a of the passivation layer 110 and the floor surface and an inclined surface of the concave portion 130. That is, the adhesive member 120 may be provided to wholly cover a portion of a front surface of the passivation layer 110 except the contact holes. In other words, the adhesive member 120 may be disposed between the passivation layer 110 and the planarization layer 160 and may be disposed between the passivation layer 110 and the light emitting device 150. In other embodiments, the adhesive member 120 may be coated on the whole top 110a of the passivation layer 110, where the concave portion 130 is provided, to a certain thickness. A portion of the adhesive member 120 coated on the top 110a of the passivation layer 110, where the contact holes are to be provided, may be removed when forming the contact holes. Therefore, in the present embodiment, immediately before a mounting process for the light emitting device 150, the adhesive member 120 may be coated on the whole top 110a of the passivation layer 110 to have a certain thickness, and thus, according to the present embodiment, a process time taken in forming the adhesive member 120 is shortened.

In the present embodiment, the adhesive member 120 may be provided on the whole top 110a of the passivation layer 110, and thus, the planarization layer 160 according to the present embodiment is provided to cover the adhesive member 120.

A mounting process for a light emitting device according to an embodiment may include a process of mounting a red light emitting device on each of red subpixels SP1, a process of mounting a green light emitting device on each of green subpixels SP2, and a process of mounting a blue light emitting device on each of blue subpixels SP3, and moreover, may further include a process of mounting a white light emitting device on each of white subpixels.

The mounting process for the light emitting device according to an embodiment may include only a process of mounting the white light emitting device on each of subpixels. In this case, the first base substrate 100 may include a color filter layer overlapping each subpixel. The color filter layer may transmit only light, having a wavelength of a color corresponding to a corresponding subpixel, of white light.

The mounting process for the light emitting device according to an embodiment may include only a process of mounting a first-color light emitting device on each subpixel. In this case, the first base substrate 100 may include a wavelength conversion layer and the color filter layer overlapping each subpixel. The wavelength conversion layer may emit light of a second color, based on some of light of the first color incident from the first-color light emitting device. The color filter layer may transmit only light, having a wavelength of a color corresponding to a corresponding subpixel, of white light based on a combination of the light of the first color and the light of the second color. Here, the first color may be blue, and the second color may be yellow. The wavelength conversion layer may include a phosphor or a quantum dot which emits the light of the second color, based on some of the light of the first color.

The display device according to the present embodiment provides the same effects as those of the above-described display device, and since the light emitting device 150 is accommodated into the concave portion 130 provided in each of the subpixels SP1 to SP3, alignment precision is enhanced in the mounting (or transfer) process for the light emitting device 150, thereby enhancing productivity.

Figure 12:
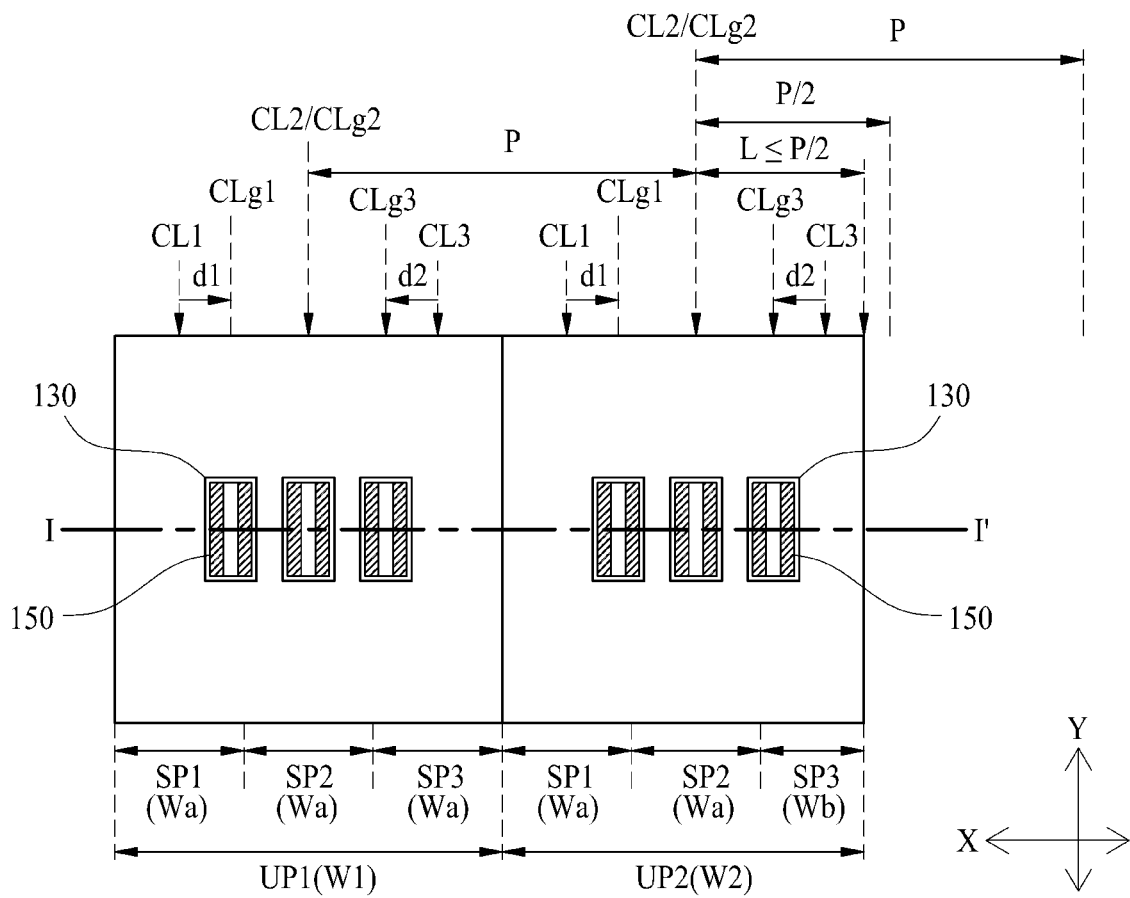
FIG. 12 is a plan view for describing a concave portion provided in a unit pixel according to an embodiment of the present disclosure.
Figure 13:
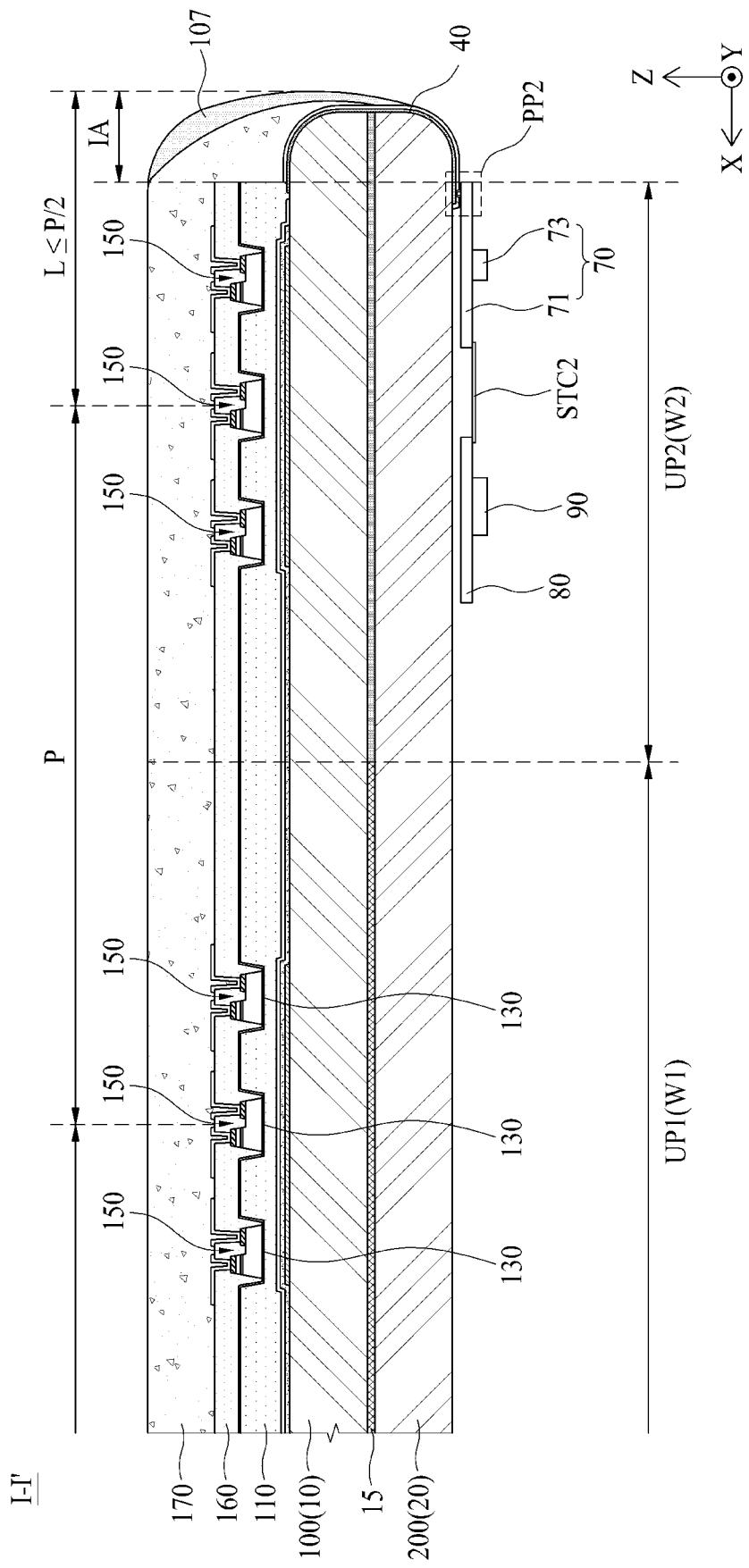
FIG. 13 is a cross-sectional view taken along line I-I' illustrated in FIG. 12.

FIG. 12 is a plan view for describing a concave portion provided in a unit pixel according to an embodiment of the present disclosure, and FIG. 13 is a cross-sectional view taken along line I-I' illustrated in FIG. 12.

Referring to FIGS. 12 and 13, in the present embodiment, first to third subpixels SP1 to SP3 configuring each of a plurality of first unit pixels UP1 may each include a concave portion 130 which is provided concavely from a top of a passivation layer 110.

First, in each of the first unit pixels UP1, the second subpixel SP2 may be provided in the middle of a unit pixel area, the first subpixel SP1 may be provided on one side of the second subpixel SP2, and the third subpixel SP3 may be provided on the other side of the second subpixel SP2.

The concave portion 130 provided in the second subpixel SP2 may have a planarly tetragonal shape, and a center line CLg2 of the concave portion 130 with respect to a first horizontal axis direction X may match a second center line CL2 of the second subpixel SP2. For example, the concave portion 130 of the second subpixel SP2 may be provided in a center portion of the first unit pixel UP1. Therefore, a distance L between a center portion of the concave portion 130 provided in the second subpixel SP2 and an outer surface of a first base substrate 100 may be set to half "P/2" or less of a reference pixel pitch P.

The concave portion 130 provided in the first subpixel SP1 may have a planarly tetragonal shape and may be provided close to the concave portion 130 provided in the second subpixel SP2. That is, a center line CLg1 of the concave portion 130 provided in the first subpixel SP1 with respect to the first horizontal axis direction X may be provided at a position which is spaced apart from a center line CL1 of the first subpixel SP1 by a first distance d1 in a direction toward the second subpixel SP2.

The concave portion 130 provided in the third subpixel SP3 may have a planarly tetragonal shape and may be provided close to the concave portion 130 provided in the second subpixel SP2. That is, a center line CLg3 of the concave portion 130 provided in the third subpixel SP3 with respect to the first horizontal axis direction X may be provided at a position which is spaced apart from a center line CL3 of the third subpixel SP3 by a second distance d2 in a direction toward the second subpixel SP2.

The first to third subpixels SP1 to SP3 of each of the first unit pixels UP1 may have the same width Wa with respect to the first horizontal axis direction X.

In each of the first unit pixels UP1, the concave portions 130 respectively provided in the first to third subpixels SP1 to SP3 may be provided to concentrate on a center portion of the first unit pixel UP1. Each first unit pixel UP1 may have a first width W1 corresponding to a predetermined resolution, and the plurality of first unit pixels UP1 may be arranged at the reference pixel pitch P. Here, the reference pixel pitch P may be defined as a distance between center portions of two first unit pixels UP1 which are adjacent to each other with respect to the first horizontal axis direction X and a second horizontal axis direction Y. In other words, the reference pixel pitch P may be defined as a distance between the same subpixels provided in two first unit pixels UP1 which are adjacent to each other with respect to the first horizontal axis direction X. That is, the reference pixel pitch P may be defined as a distance between light emitting devices 150 respectively provided in second subpixels SP2 of two adjacent first unit pixels UP1. For example, the first unit pixel UP1 may be configured with a red subpixel SP1, a green subpixel SP2, and a blue subpixel SP3, and in this case, the reference pixel pitch P may be a distance between concave portions 130 (or light emitting devices 150) respectively provided in adjacent red subpixels SP1, a distance between concave portions 130 (or light emitting devices 150) respectively provided in adjacent green subpixels SP2, or a distance between concave portions 130 (or light emitting devices 150) respectively provided in adjacent blue subpixels SP3, with respect to the first horizontal axis direction X.

In each of the plurality of second unit pixels UP2, the second subpixel SP2 may be provided in the middle of a unit pixel area, the first subpixel SP1 may be provided on one side of the second subpixel SP2, and the third subpixel SP3 may be provided on the other side of the second subpixel SP2 and may be provided adjacent to the outer surface of the first base substrate 100. Here, the outer surface of the first base substrate 100 may be defined as a side wall vertical to an end of a front surface 100a of the first base substrate 100, or may be defined as an outermost surface of the first base substrate 100 exposed to the outside. That is, the side wall of the first base substrate 100 may be directly exposed to the outside, or may be covered by structures such as a routing line, a passivation layer, etc., and thus may not be directly exposed to the outside. Therefore, the outer surface of the first base substrate 100 may be defined as the outermost surface of the first base substrate 100 exposed to the outside.

The concave portions 130 respectively provided in the first to third subpixels SP1 to SP3 in each second unit pixel UP2 are the same as the concave portions of the first unit pixels UP1, and thus, their repetitive descriptions are not provided.

In each of the second unit pixels UP2, since each of the first and second subpixels SP1 and SP2 is adjacent to a corresponding first unit pixel UP1, each of the first and second subpixels SP1 and SP2 may be provided to have the width Wa which is the same as that of each of subpixels of the corresponding first unit pixel UP1.

On the other hand, the third subpixel SP3 of each second unit pixel UP2 may be provided to have a width Wb which is narrower than the width Wa of each of the first and second subpixels SP1 and SP2. In detail, in each second unit pixel UP2, the concave portions 130 may be provided to concentrate on center portions of unit pixels, and thus, even when a portion of an area of the third subpixel SP3 adjacent to the non-display area IA of the first base substrate 100 is removed, the quality of an image displayed on a corresponding unit pixel UP2 is not affected. Therefore, the width Wb of the third subpixel SP3 with respect to the first horizontal axis direction X may be reduced by the second distance d2 at which the light emitting device 150 mounted on the third subpixel SP3 is disposed close to the second subpixel SP2 with respect to the center line CL3 of the third subpixel SP3. In this case, a maximum distance L between the second unit pixel UP2 and the outer surface of the first base substrate 100 may be set to half "P/2" or less of the reference pixel pitch P at which the plurality of first unit pixels UP1 are arranged, namely, may be set equal to or less than half of the reference pixel pitch P. Therefore, since a size of each of the third subpixels SP3 is reduced in the second unit pixels UP2 adjacent to a bezel area of the first base substrate 100, the display device according to the present embodiment has a bezel width suitable for a boundary portion between display devices connected to each other in a multi-screen display device.

In addition, the display device according to an embodiment of the present disclosure may further include a side sealing member 107.

The side sealing member 107 may be provided to cover the outer surface of the first base substrate 100 and a side surface of the transparent buffer layer 170. The side sealing member 107 according to an embodiment may be formed of a silicon-based or UV curing-based sealant (or resin), but considering a process tack time, the side sealing member 107 may be formed of a UV curing-based sealant. Also, the side sealing member 107 may have a color (for example, blue, red, green, or black), or may be formed of a colored resin or a light blocking resin for preventing side light leakage without being limited thereto. The side sealing member 107 prevents side light leakage while light emitted from the light emitting device 150 of each subpixel SP travels in a direction from the inside of the transparent buffer layer 170 to an outermost surface, and buffers an external impact to prevent a side surface of each of the first base substrate 100 and the transparent buffer layer 170 from being damaged by the external impact.

Figure 14:
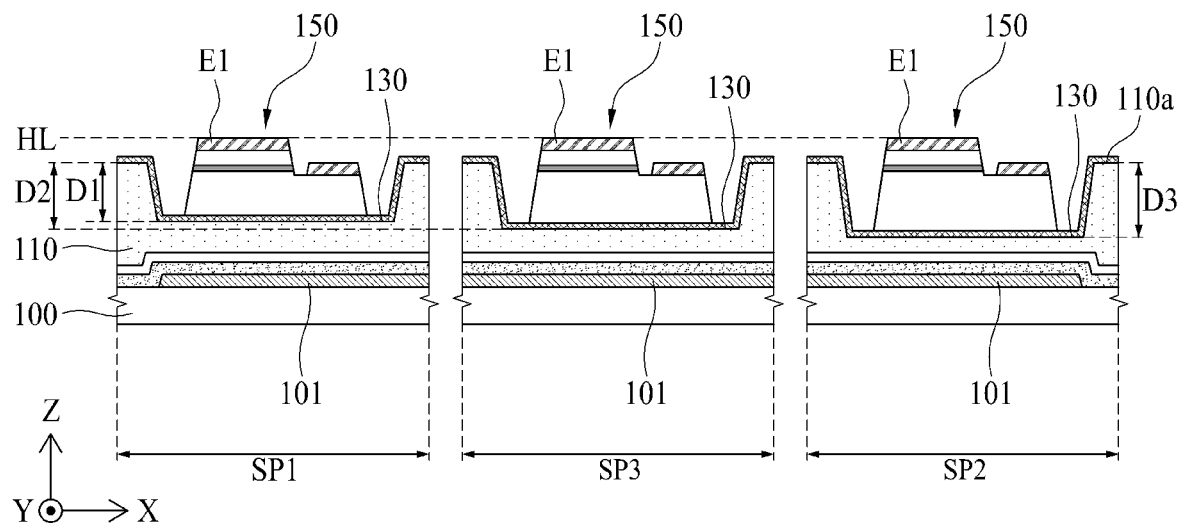
FIG. 14 is a cross-sectional view for describing a modification embodiment of a concave portion according to an embodiment of the present disclosure.

FIG. 14 is a cross-sectional view for describing a modification embodiment of a concave portion according to an embodiment of the present disclosure.

Referring to FIG. 14, a plurality of concave portions 130 respectively provided in a plurality of subpixels SP1 to SP3 of each of a plurality unit pixels UP1 and UP2 according to the modification embodiment may have the same shapes and may be formed concavely from a passivation layer 110 to have different depths D1 to D3 in respective subpixels SP.

The concave portions 130 according to an embodiment may be provided to have the different depths D1 to D3 from the passivation layer 110, based on a height of a light emitting device 150 which is to be provided in a corresponding subpixel, thereby removing or minimizing a height deviation (or a step height) between light emitting devices by colors.

In order to realize a color image, the display device according to the present embodiment may include a red subpixel SP1, a green subpixel SP2, and a blue subpixel SP3, and the light emitting device 150 may be provided by colors and may be disposed in the concave portion 130 provided in a subpixel having a corresponding color. In this case, the color-based light emitting devices 150 may have different heights (or thicknesses) due to a process error of a manufacturing process. For example, thicknesses of the color-based light emitting devices 150 may be thickened in the order of red, green, and blue. In this case, the depths D1 to D3 of the concave portions 130 may be deeply provided in the order of the red subpixel SP1, the green subpixel SP2, and the blue subpixel SP3, based on a height of a corresponding light emitting device 150.

Therefore, in the present embodiment, the depths of the concave portions 130 provided in respective subpixels may be differently set based on a height (or a thickness) of the light emitting device 150 which is to be provided in a corresponding subpixel, and thus, uppermost surfaces (for example, tops of first electrodes E1) of the color-based light emitting devices 150 disposed in respective subpixels may be disposed on the same horizontal line HL, thereby preventing an open defect, where first electrodes (or second electrodes) of the color-based light emitting devices 150 are not exposed, from occurring due to a thickness deviation between the color-based light emitting devices 150 in a patterning process for first and second electrode contact holes. Also, in the present embodiment, in the top emission structure, an optical distance between a reflective layer 101 and the color-based light emitting devices of each subpixel is optimized by using the concave portions 130 which are provided to the different depths D1 to D3 in respective subpixels, and thus, a reflection efficiency of the reflective layer 101 is improved, thereby maximizing a light efficiency of each of the light emitting devices.

Figure 15:
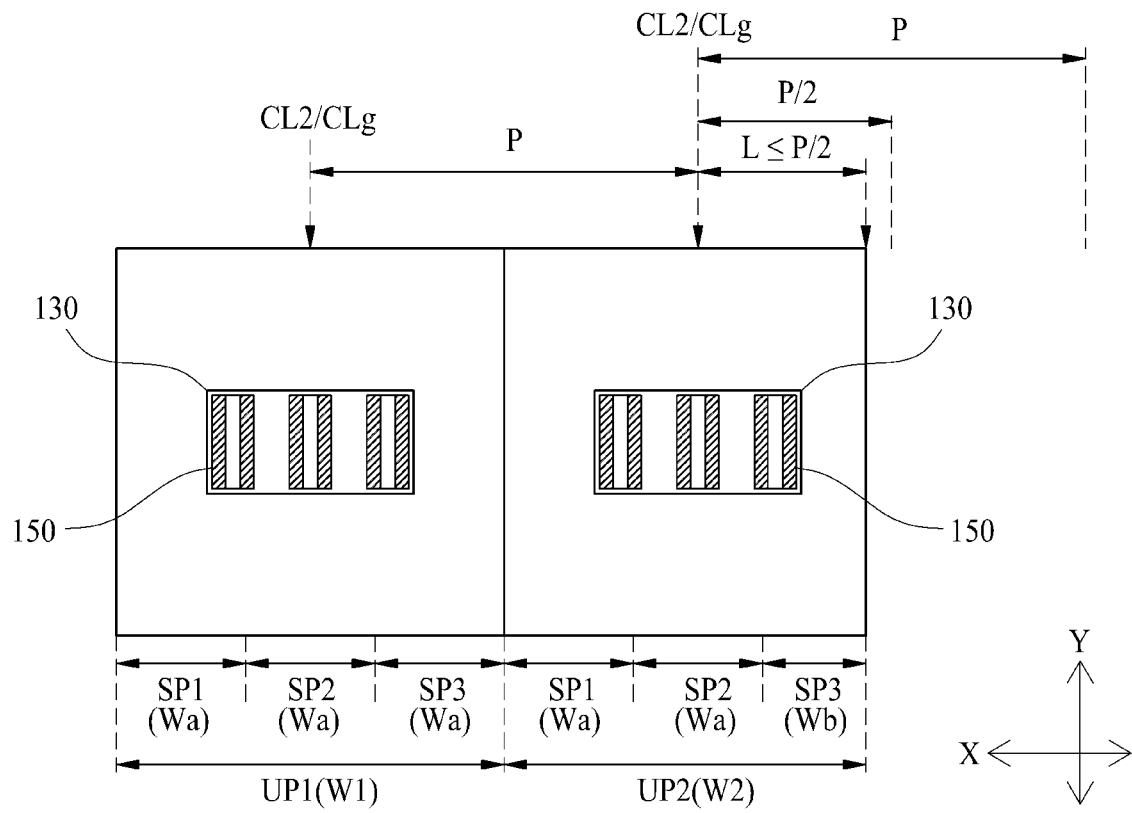
FIG. 15 is a plan view for describing a modification embodiment of a concave portion according to an embodiment of the present disclosure.

FIG. 15 is a plan view for describing a modification embodiment of a concave portion according to an embodiment of the present disclosure.

Referring to FIG. 15, in the present embodiment, a plurality of concave portions 130 respectively provided in a plurality of subpixels SP1 to SP3 of each of a plurality of unit pixels UP1 and UP2 may communicate with each other without a boundary portion and may include one accommodating space. That is, each of a plurality of first unit pixels UP1 and each of a plurality of second unit pixels UP2 may include only one concave portion 130 provided all over first to third subpixels SP1 to SP3.

The concave portion 130 may have a tetragonal shape which extends toward the first subpixel SP1 and the third subpixel SP3 with respect to a center portion of each of the unit pixels UP1 and UP2 or a center line CL2 of the second subpixel SP2. That is, a center line CLg of the concave portion 130 may match the center line CL2 of the second subpixels SP2 with respect to the first horizontal axis direction X.

As described above, in the present embodiment, since the one concave portion 130 is provided in the unit pixels UP1 and UP2, deviation of the light emitting device 150 is prevented in a mounting process for a light emitting device 150 corresponding to each of the subpixels SP1 to SP3, and an alignment precision of the light emitting device 150 is enhanced.

Figure 16:
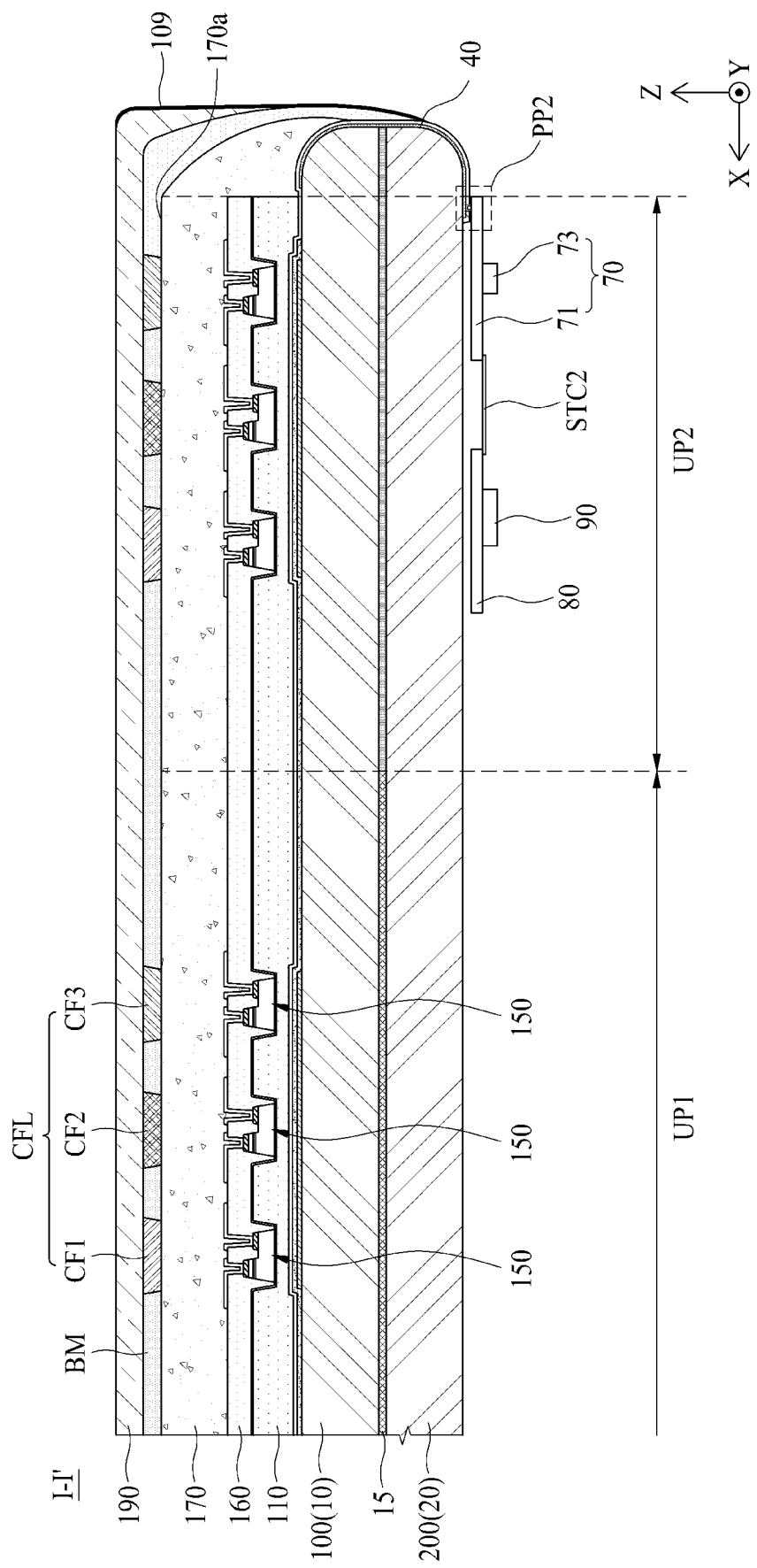
FIG. 16 is another cross-sectional view taken along line I-I' illustrated in FIG. 12.

FIG. 16 is another cross-sectional view taken along line I-I' illustrated in FIG. 12 and illustrates an example where a color filter is added to the display device according to an embodiment of the present disclosure. Hereinafter, therefore, only an element added to the display device according to an embodiment of the present disclosure will be described.

Referring to FIG. 16 along with FIG. 12, the display device according to the present embodiment may further include a black matrix BM and a color filter layer CFL.

First, a light emitting device 150 provided in each of a plurality of subpixels SP1 to SP3 may emit white light. That is, all the light emitting devices 150 provided on a first base substrate 100 may be white light emitting devices emitting white light.

The black matrix BM may define an opening area of each of the subpixels SP1 to SP3 and may be directly provided on a top 170a of a transparent buffer layer 170 which overlaps the light emitting device 150 of each of the subpixels SP1 to SP3 in a one-to-one relationship, thereby preventing color mixture between adjacent subpixels SP1 to SP3. The black matrix BM may include a light absorbing material.

Optionally, the black matrix BM may be provided to cover side surface of the transparent buffer layer 170 and an outer surface of the first base substrate 100. In this case, the black matrix BM prevents side light leakage while light emitted from the light emitting device 150 of each of the subpixels SP1 to SP3 travels in a direction from the inside of the transparent buffer layer 170 to an outermost surface.

The color filter layer CFL may be directly formed on a top 170a of the transparent buffer layer 170 overlapping the opening area defined by the black matrix BM and may include a red color filter CF1, a green color filter CF2, and a blue color filter CF3 corresponding to respective colors defined in the plurality of subpixels SP1 to SP3. The color filter layer CFL may transmit only light, having a wavelength of a color corresponding to a corresponding subpixel SP, of the white light emitted from each of the subpixels SP1 to SP3.

In addition, the display device according to the present embodiment may further include a cover layer 190.

The cover layer 190 may be provided on the first base substrate 100 to cover the black matrix BM and the color filter layer CFL. The cover layer 190 according to an embodiment may be formed of a material having a relatively low refractive index. For example, the cover layer 190 may be formed of LiF, $MgF_2$, $CaF_2$, $ScF_3$, and/or the like and may have a multi-layer structure having different refractive indexes. The cover layer 190 may be provided on the first base substrate 100 to cover the black matrix BM and the color filter layer CFL, thereby protecting each of the subpixels SP1 to SP3 and efficiently outputting light, emitted from a light emitting device 150 of each of the subpixels SP1 to SP3, to the outside.

Optionally, the display device according to the present embodiment may further include a side coating layer 109.

The side coating layer 109 may be provided to cover an outer surface of the cover layer 109. The side coating layer 109 according to an embodiment may be provided to cover the outer surface of the cover layer 190 through a coating process using a black ink including a black-based light absorbing material. Furthermore, the side coating layer 109 may be additionally provided on the outer surface of the first base substrate 100, a side surface of the black matrix BM, and an outer surface of a second base substrate 200. The side coating layer 109 prevents side light leakage while light emitted from the light emitting device 150 of each of the subpixels SP1 to SP3 travels in a direction from the inside of the cover layer 190 to an outermost surface.

The cover layer 190 may be replaced with a transparent substrate including a glass material or a transparent plastic material, and in this case, the transparent substrate may be adhered to the black matrix BM and the color filter layer CFL by using a transparent adhesive member. Furthermore, the black matrix BM and the color filter layer CFL may be provided on the transparent substrate without being directly be formed on a top 170a of the transparent buffer layer 170, and in this case, the transparent substrate including the black matrix BM and the color filter layer CFL may be adhered to the top 170a of the transparent buffer layer 170 by using the transparent adhesive member.

As described above, in the present embodiment, since the light emitting devices 150 having the same color are respectively mounted on the subpixels SP1 to SP3, a mounting process for the light emitting devices 150 may be performed without differentiating light emitting devices by colors, thereby shortening a mounting process time taken in the mounting process for the light emitting devices.

Figure 17:
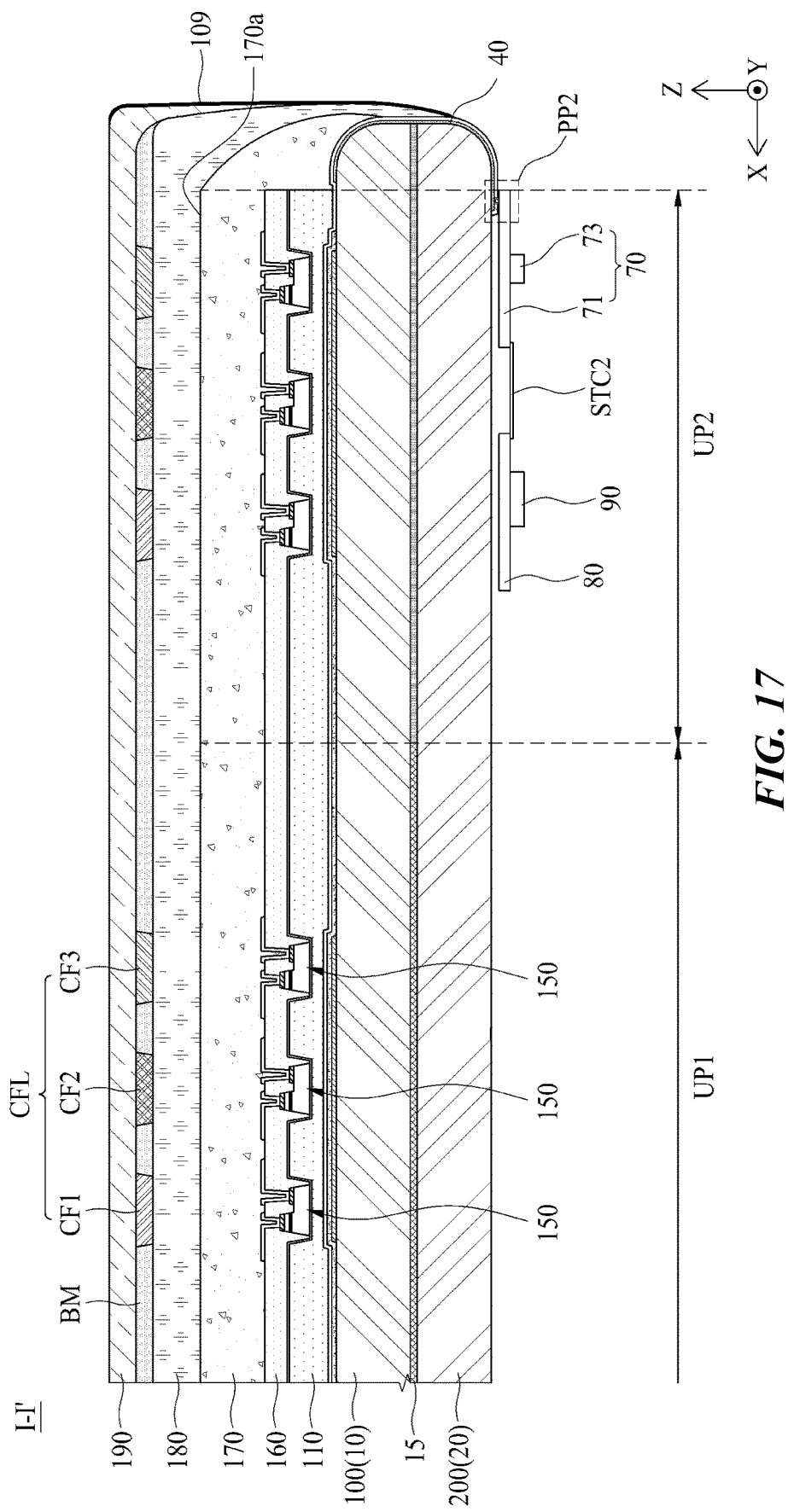
FIG. 17 is another cross-sectional view taken along line I-I' illustrated in FIG. 12.

FIG. 17 is another cross-sectional view taken along line I-I' illustrated in FIG. 12 and illustrates an example where a wavelength conversion layer is added to the display device illustrated in FIG. 16. Hereinafter, therefore, the wavelength conversion layer and elements relevant thereto will be described.

Referring to FIG. 17, in the display device according to the present embodiment, if a light emitting device 150 emitting light of a first color except white is identically disposed in each of a plurality of subpixels SP1 to SP3, a wavelength conversion layer 180 may be provided on a top of a transparent buffer layer 170, for realizing colors through a plurality of unit subpixels UP1 and UP2. That is, the wavelength conversion layer 180 may be provided between the color filter layer CFL and the color filter layer 170.

The wavelength conversion layer 180 may emit light of a second color, based on the light of the first color incident from the light emitting device 150 of each of the subpixels SP1 to SP3. That is, the wavelength conversion layer 180 may absorb the light of the first color and may emit the light of the second color through re-emission. Here, the light of the first color may be blue light, and the light of the second color may be yellow light.

For example, the wavelength conversion layer 180 may be directly coated on a top 170a of the transparent buffer layer 170 in a liquid state, and then, may be cured by a curing process using heat and/or light. As another example, the wavelength conversion layer 180 may be manufactured in a sheet form and may be directly adhered to the top 170a of the transparent buffer layer 170.

The wavelength conversion layer 180 according to an embodiment may include a phosphor or a quantum dot.

The phosphor according to an embodiment may be a yellow phosphor which is excited by blue light to emit yellow light, and for example, may be an yttrium aluminum garnet (YAG)-based material.

The quantum dot according to an embodiment may be excited by blue light to emit yellow light and may have a size for emitting light having a yellow wavelength, and for example, may include CdS, CdSe, CdTe, ZnS, ZnSe, GaAs, GaP, GaAs—P, Ga—Sb, InAs, InP, InSb, AlAs, AlP, AlSb, and/or the like.

The light of the second color, which is re-emitted from the wavelength conversion layer 180 according to the present embodiment and is irradiated onto a cover layer 190, may be combined with the light of the first color irradiated onto the cover layer 190 without being re-emitted from the wavelength conversion layer 180, and thus, may be converted into white light. The white light may be filtered by a color filter overlapping each of the subpixels SP1 to SP3, and thus, may be emitted as color light corresponding to each of the subpixels SP1 to SP3.

Except that the black matrix BM and the color filter layer CFL are provided on the top 170a of the wavelength conversion layer 180, the black matrix BM and the color filter layer CFL are the same as FIG. 16, and thus, their detailed descriptions are not repeated.

As described above, in the present embodiment, since the light emitting devices 150 having the same color are respectively mounted on the subpixels SP1 to SP3, a mounting process for the light emitting devices 150 may be performed without differentiating light emitting devices by colors, thereby shortening a mounting process time taken in the mounting process for the light emitting devices.

The cover layer 190 may be replaced with a transparent substrate including a glass material or a transparent plastic material, and in this case, the transparent substrate may be adhered to the wavelength conversion layer 180 by using a transparent adhesive member. Furthermore, the wavelength conversion layer 180 may be provided on the transparent substrate without being directly be formed on a top 170a of the transparent buffer layer 170, and in this case, the transparent substrate may be adhered to the top 170a of the transparent buffer layer 170 by using the transparent adhesive member.

In the display device according to the embodiments of the present disclosure, a micro light emitting diode display device including a subpixel including a light emitting device has been described above as an example, but the technical features of the line substrate according to the embodiments of the present disclosure may be identically applied to all flat panel display devices such as LCD devices, organic light emitting display devices, and quantum dot display devices, in addition to the micro light emitting diode display device.

Figure 18:
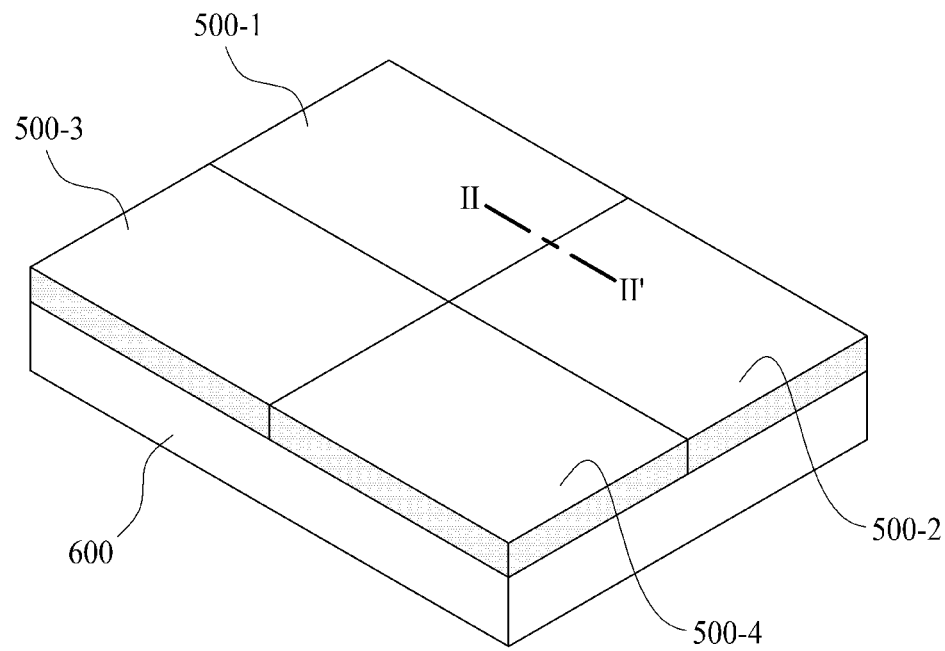
FIG. 18 is an isometric view for describing a multi-screen display device according to an embodiment of the present disclosure.
Figure 19:
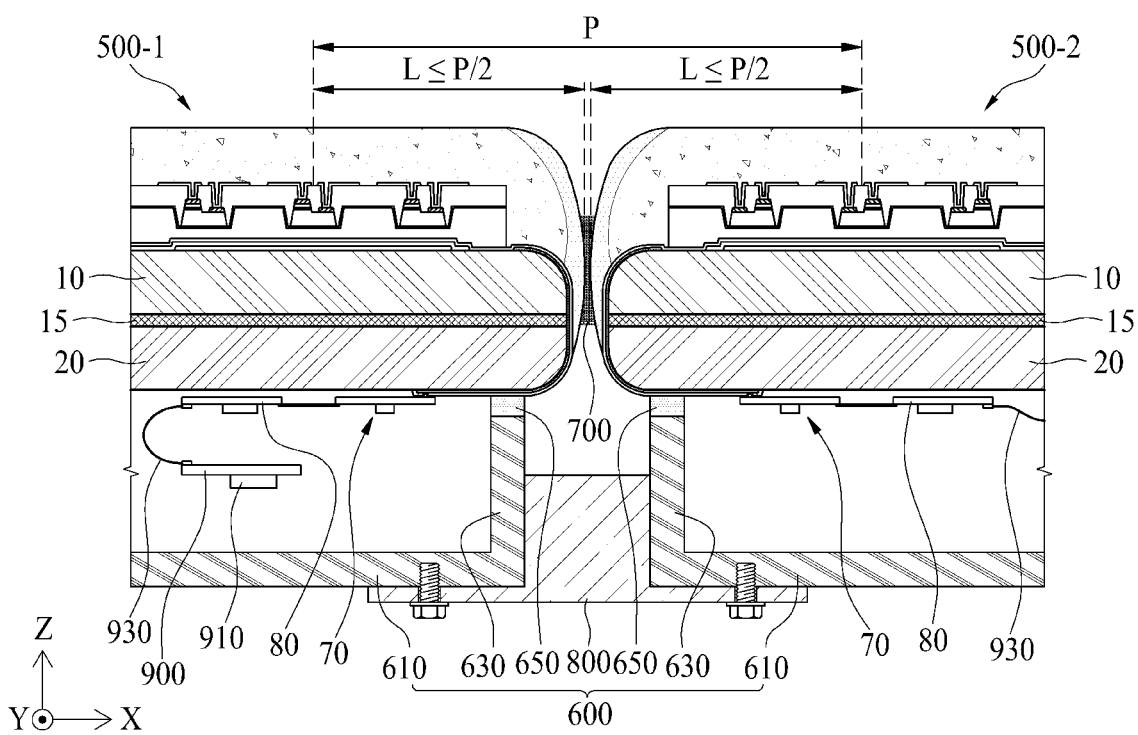
FIG. 19 is a cross-sectional view taken along line II-II' illustrated in FIG. 18.

FIG. 18 is an isometric view for describing a multi-screen display device according to an embodiment of the present disclosure, and FIG. 19 is a cross-sectional view taken along line II-II' illustrated in FIG. 18.

Referring to FIGS. 18 and 19 along with FIG. 13, the multi-screen display device according to the present embodiment may include a plurality of screen modules 500-1 to 500-4 and a housing 600.

The plurality of screen modules 500-1 to 500-4 may be arranged in an N×M form (where N is a positive integer equal to or more than two, and M is a positive integer equal to or more than two) to respectively display individual images or divisionally display one image. The plurality of screen modules 500-1 to 500-4 may each include the light emitting diode display device according to the embodiments of the present disclosure illustrated in FIGS. 1 to 17, and a repetitive description on the display device is not provided.

Side surfaces of the plurality of screen modules 500-1 to 500-4 according to an embodiment may be coupled to each other by a module coupling member 700 provided on the outer surface of the first base substrate 100. The module coupling member 700 may couple the side surfaces of two adjacent screen modules of the plurality of screen modules 500-1 to 500-4 arranged in a lattice form, thereby implementing the multi-screen display device. The module coupling member 700 according to an embodiment may be formed of an adhesive or a double-sided tape which enables a relatively thin thickness, for minimizing a space between two adjacent screen modules of the plurality of screen modules 500-1 to 500-4.

In each of the plurality of screen modules 500-1 to 500-4, a maximum distance L between the second unit pixel UP2 and the outer surface of the display substrate 10 may be half "P/2" or less of the reference pixel pitch P at which the plurality of first unit pixels UP1 are arranged. Therefore, a maximum distance between second unit pixels UP2 of two adjacent screen modules of which side surfaces are coupled to each other with the module coupling member 700 therebetween may be equal to or less than the reference pixel pitch P. In other words, a pixel pitch between the second unit pixels UP2 of two adjacent screen modules may be equal to or less than the reference pixel pitch P at which the first unit pixels UP1 respectively provided in the plurality of screen modules 500-1 to 500-4 are arranged. Therefore, in the present embodiment, an area where a dark portion caused by a boundary portion between two adjacent screen modules of the screen modules 500-1 to 500-4 occurs is minimized or removed, and thus, an image where a sense of discontinuity of a whole screen is minimized may be displayed.

The housing 600 may support a rear edge of each of the plurality of screen modules 500-1 to 500-4 and may cover a rear surface of the plurality of screen modules 500-1 to 500-4. The housing 600 according to an embodiment may include a housing plate 610, covering the rear surface of each of the plurality of screen modules 500-1 to 500-4, and a housing side wall 630 which is provided vertical to the housing plate 610 and supports the rear edge of each of the plurality of screen modules 500-1 to 500-4.

The housing plate 610 according to an embodiment may be configured as one body covering the whole rear surface of each of the plurality of screen modules 500-1 to 500-4.

The housing plate 610 according to an embodiment may be configured with a plurality of division plates to overlap the rear surface of each of the plurality of screen modules 500-1 to 500-4.

The housing side wall 630 may be installed vertical to a top of the housing plate 610 overlapping the rear edge of each of the plurality of screen modules 500-1 to 500-4 and may individually support the rear edge of each of the plurality of screen modules 500-1 to 500-4. In this case, the housing side wall 630 may support the rear edge of each of the plurality of screen modules 500-1 to 500-4 through a module supporting member 650. Here, the module supporting member 650 may be an elastic member, a foam pad, a double-sided tape, or the like.

In addition, the housing 600 may include a plurality of module housings including the housing plate 610 and the housing side wall 630. Each of the plurality of housing modules may individually support the rear edges of the plurality of screen modules 500-1 to 500-4 and may cover the rear surfaces of the plurality of screen modules 500-1 to 500-4. In this case, the housing 600 may include a housing coupling member 800 provided between the plurality of module housings. The housing coupling member 800 may be inserted into a space between adjacent module housings and may be fixed to the housing plate 610 of each of adjacent module housings by a fastening member such as a bolt, a screw, and/or the like.

In addition, the multi-screen display device according to the present embodiment may further include an integration control board 900 and an image signal generator 910 mounted on the integration control board 900.

The integration control board 900 may be disposed in an accommodating space provided on the rear surface of each of the plurality of screen modules 500-1 to 500-4 by the housing 600. The integration control board 900 may be connected to the control board 250 of each of the plurality of screen modules 500-1 to 500-4 through at least one signal cable 930.

The image signal generator 910 may be mounted on the integration control board 900. The image signal generator 910 may receive a raw image signal supplied from an external host driving system and may generate a module-based input image signal corresponding to each of images which are to be respectively displayed by display devices of the plurality of screen modules 500-1 to 500-4, based on the received raw image signal. That is, the image signal generator 910 may receive all resolution information, including a first display area AA1 and a second display area AA2, about each of the plurality of screen modules 500-1 to 500-4, divide the raw image signal according to the resolution information about each module to generate the module-based input image signal, and supply the module-based input image signal to a corresponding screen module of the plurality of screen modules 500-1 to 500-4. Therefore, each of the plurality of screen modules 500-1 to 500-4 may display a module-based image corresponding to module-based panel image data, based on the input image signal supplied from the image signal generator 910.

As described above, since the multi-screen display device according to the present embodiment includes the screen modules 500-1 to 500-4 configured with the light emitting diode display device according to the embodiments of the present disclosure, an area where a dark portion caused by a boundary portion between two adjacent screen modules of the screen modules 500-1 to 500-4 occurs is minimized or removed, and thus, an image where a sense of discontinuity of a whole screen is minimized may be displayed.

Figure 20A:
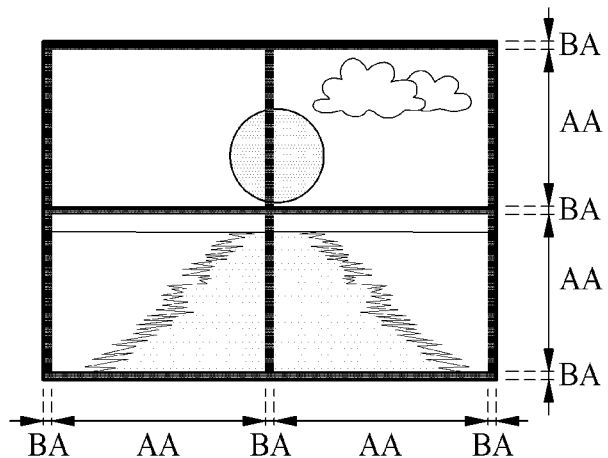
FIG. 20A is a multi-screen display device of the related art.
Figure 20B:
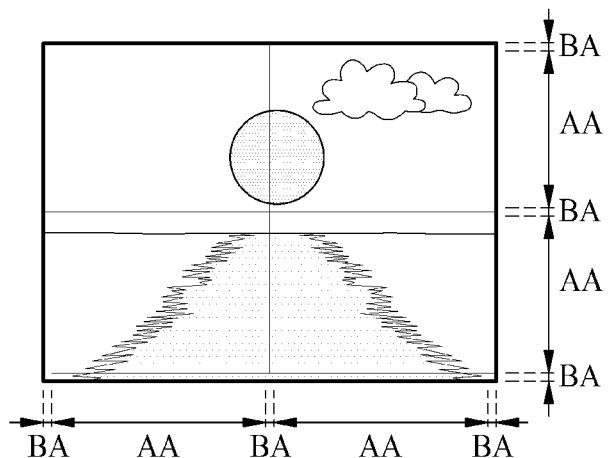
FIG. 20B is a multi-screen display device according to an embodiment of the present disclosure.

FIG. 20A is a multi-screen display device of the related art. FIG. 20B is a multi-screen display device according to an embodiment of the present disclosure.

First, referring to FIG. 20A, in the related art multi-screen display device, since an image is displayed on only a display area AA of each of a plurality of display devices, it can be seen that due to a bezel area BA based on a front case of each of the plurality of display devices, a dark portion occurs in a boundary portion between display devices coupled to each other, and a disconnected image caused by the dark portion of the boundary portion is displayed in a whole screen.

On the other hand, referring to FIG. 20B, in the multi-screen display device according to the embodiments of the present disclosure, since a pixel pitch between second unit pixels of two adjacent screen modules of which side surfaces are coupled to each other is equal to or less than a reference pixel pitch of a first unit pixel, it can be seen that an area where a dark portion caused by a boundary portion between a plurality of screen modules occurs is minimized or removed, and thus, an image where a sense of discontinuity of a whole screen is minimized is displayed.

As a result, even in a case where side surfaces of a plurality of screen modules are coupled to each other in a lattice form, the multi-screen display device according to the embodiments of the present disclosure may display one image where a sense of discontinuity of a whole screen is minimized, thereby enhancing a degree of viewing immersion of a user for an image displayed on a large-size screen.

As described above, according to the embodiments of the present disclosure, the display device has a minimized or zeroed bezel area by removing a pad part provided in a bezel area of a display substrate and has a bezel width suitable for minimizing a boundary portion between display devices coupled to each other in a multi-screen display device. Also, according to the embodiments of the present disclosure, one image where a sense of discontinuity of a whole screen is minimized is displayed even in a case where side surfaces of a plurality of screen modules are coupled to each other in a lattice form, thereby enhancing a degree of viewing immersion of a user for an image displayed on a large-size screen.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate including a display area and a non-display area adjacent to the display area, the display area including a plurality of subpixels and the non-display area including a data pad part electrically connected to the plurality of data lines in a one-to-one relationship;
a plurality of thin film transistors (TFTs) disposed in the each of subpixels;
a passivation layer disposed on the plurality of TFTs;
a light emitting device disposed on the passivation layer in the each of subpixels, the light emitting device having an upper surface, a lower surface, and a side surface between the upper surface and the lower surface;
an adhesive member disposed between the passivation layer and the light emitting device, the adhesive member in contact with an entire lower surface of the light emitting device,
a planarization layer disposed on the upper surface and the side surface of the light emitting device; and
a buffer layer disposed on the planarization layer and the data pad part in the non-display area,
wherein the light emitting device is micro-LED, and
wherein the light emitting device includes a first electrode and a second electrode disposed on the upper surface of the light emitting device.

2. The display device of claim 1, further comprising a routing film electrically connected to the data pad part and extended along to a side surface of substrate.

3. The display device of claim 2, further comprising a sealing member disposed on the routing film, the buffer layer, and the side surface of substrate.

4. The display device of claim 3, wherein the sealing member is colored.

5. The display device of claim 1, wherein the adhesive member disposed on all of the surface of the substrate.

6. The display device of claim 5, wherein the adhesive member extends to at least partially overlap a data pad portion of the non-display area.

7. The display device of claim 1, further comprising a plurality of common power lines disposed on one side of the plurality of subpixels.

8. The display device of claim 7, wherein the each of subpixels comprises a switching TFT, a driving TFT, and a capacitor.

9. The display device of claim 8, wherein the light emitting device is electrically connected to the driving TFT of the each of subpixels using a pixel electrode, and is electrically connected to the common power line using a common electrode.

10. The display device of claim 9, wherein:
the pixel electrode and the common electrode are disposed on an upper surface of the planarization layer; and
the planarization layer includes a hole exposing a first electrode and a second electrode of the light emitting device.

11. The display device of claim 7, further comprising a plurality of driving power lines disposed on the one side of the plurality of subpixels.

12. The display device of claim 11, wherein the plurality of driving power lines and the plurality of common power lines are disposed either in parallel to each other or to intersect with each other.

13. The display device of claim 1, wherein:
the display area includes a first display area and a second display area overlapped with an edge of the substrate;
a plurality of first unit pixels includes the plurality of subpixels and is disposed in the first display area; and
a plurality of second unit pixels includes the plurality of subpixels and is disposed in the second display area.

14. The display device of claim 13, wherein:
the plurality of first unit pixels is arranged at a reference pixel pitch; and
wherein a distance between a center portion of each of the second unit pixels and an outer surface of the substrate is half or less of the reference pixel pitch.

15. The display device of claim 14, wherein the at least one of the plurality of second unit pixels is configured to have the size less than the size of the at least one of the plurality of first unit pixels.

16. The display device of claim 14, wherein:
the reference pixel pitch is a distance between center portions of two first unit pixels adjacent to each other; and
the plurality of first unit pixels is configured to have a same size and is arranged at a same reference pixel pitch.

17. The display device of claim 1, further comprising a reflective layer overlapped the light emitting device under the passivation layer.

18. The display device of claim 1, further comprising a first flexible printed circuit board overlapped at one of the plurality of subpixels on the substrate.

19. The display device of claim 5, wherein the ends of at least two of the passivation layers, the planarization layer, and the adhesive member overlap in the non-display area.

20. The display device of claim 1, wherein the size of the light emitting element is smaller than the area of the light emitting area of each of subpixels.

21. The display device of claim 1, wherein the passivation layer includes a concave portion in which the light emitting device is accommodated, and the planarization layer fills a remaining area of the concave portion in which the light emitting device is not accommodated.

* * * * *

UNITED STATES PATENT AND TRADEMARK OFFICE
CERTIFICATE OF CORRECTION

Page 1 of 1

PATENT NO. : 12,393,073 B2
APPLICATION NO. : 18/434661
DATED : August 19, 2025
INVENTOR(S) : WooNam Jeong et al.

It is certified that error appears in the above-identified patent and that said Letters Patent is hereby corrected as shown below:

In the Claims

<u>Column 34, Claim 19, Line 53:</u>
"device of claim 5, wherein" should read: --device of claim 1, wherein--.

Signed and Sealed this
Twenty-eighth Day of October, 2025

John A. Squires
*Director of the United States Patent and Trademark Office*